(12) United States Patent
Kanai et al.

(10) Patent No.: US 10,725,876 B2
(45) Date of Patent: Jul. 28, 2020

(54) ELECTRONIC CIRCUIT BOARD

(71) Applicant: TOSHIBA MEMORY CORPORATION, Minato-ku, Tokyo (JP)

(72) Inventors: Tatsunori Kanai, Yokohama Kanagawa (JP); Tetsuro Kimura, Tama Tokyo (JP); Yusuke Shirota, Yokohama Kanagawa (JP); Masaya Tarui, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 124 days.

(21) Appl. No.: 15/872,053

(22) Filed: Jan. 16, 2018

(65) Prior Publication Data

US 2018/0137020 A1    May 17, 2018

Related U.S. Application Data

(63) Continuation of application No. PCT/JP2015/070288, filed on Jul. 15, 2015.

(51) Int. Cl.
*G06F 11/00* (2006.01)
*G06F 11/20* (2006.01)
(Continued)

(52) U.S. Cl.
CPC .......... *G06F 11/2015* (2013.01); *G06F 1/263* (2013.01); *G06F 1/30* (2013.01);
(Continued)

(58) Field of Classification Search
CPC .... G06F 11/2015; G06F 1/30; G06F 11/2025; G06F 1/263; G06F 11/20; G06F 15/78;
(Continued)

(56) References Cited

U.S. PATENT DOCUMENTS

| | | | |
|---|---|---|---|
| 5,642,029 A | * | 6/1997 | Seragnoli ............. H02J 7/0068 320/163 |
| 7,007,077 B1 | * | 2/2006 | Shinohara ................ G06F 8/60 709/220 |

(Continued)

FOREIGN PATENT DOCUMENTS

| | | |
|---|---|---|
| JP | 63-188246 | 8/1988 |
| JP | 2002-182803 | 6/2002 |

(Continued)

OTHER PUBLICATIONS

Wikipedia "Out-of-Band management" page from date Jul. 15, 2015, retrieved using the WayBackMachine, from https://web.archive.org/web/20150712182829/https://en.wikipedia.org/wiki/Out-of-band_management (Year: 2015).*

(Continued)

*Primary Examiner* — Yair Leibovich
(74) *Attorney, Agent, or Firm* — Oblon, McClelland, Maier & Neustadt, L.L.P.

(57) ABSTRACT

According to an embodiment, an electronic circuit board includes a nonvolatile memory, a reading circuit to read data stored in the nonvolatile memory, a switch, and a communication circuit. When power is supplied from a first power source, the switch performs switching to a first state in which the nonvolatile memory and a host device configured to read and write data from and in the nonvolatile memory are connected. When power is supplied from a second power source, the switch performs switching to a second state in which the host device and the nonvolatile memory are not connected and the reading circuit and the nonvolatile memory are connected. The communication circuit transmits, to an external device, the data read by the reading circuit from the nonvolatile memory when power is being supplied from the second power source.

12 Claims, 22 Drawing Sheets

(51) Int. Cl.
*G06F 15/78* (2006.01)
*G06F 1/30* (2006.01)
*G11C 16/30* (2006.01)
*G11C 7/04* (2006.01)
*G11C 11/00* (2006.01)
*G06F 1/26* (2006.01)
*G11C 11/16* (2006.01)
*G11C 13/00* (2006.01)
*G11C 14/00* (2006.01)
*H05K 1/18* (2006.01)
*G11C 16/22* (2006.01)

(52) U.S. Cl.
CPC .......... *G06F 11/20* (2013.01); *G06F 11/2025* (2013.01); *G06F 15/78* (2013.01); *G11C 7/04* (2013.01); *G11C 11/005* (2013.01); *G11C 11/1673* (2013.01); *G11C 11/1675* (2013.01); *G11C 11/1697* (2013.01); *G11C 13/004* (2013.01); *G11C 13/0038* (2013.01); *G11C 13/0069* (2013.01); *G11C 14/009* (2013.01); *G11C 14/0036* (2013.01); *G11C 14/0045* (2013.01); *G11C 14/0081* (2013.01); *G11C 16/30* (2013.01); *H05K 1/181* (2013.01); *G06F 2201/85* (2013.01); *G11C 16/225* (2013.01); *H05K 2201/10053* (2013.01); *H05K 2201/10159* (2013.01)

(58) Field of Classification Search
CPC ....... G06F 2201/85; G11C 7/04; G11C 16/30; G11C 14/009; G11C 11/1673; G11C 11/1697; G11C 13/0038; G11C 13/004; G11C 11/1675; G11C 13/0069; G11C 14/0036; G11C 14/0045; G11C 14/0081; G11C 11/005; G11C 16/225; H05K 1/181; H05K 2201/10053; H05K 2201/10159
USPC ...................................................... 714/4.11
See application file for complete search history.

(56) References Cited

U.S. PATENT DOCUMENTS

| | | | |
|---|---|---|---|
| 8,499,182 B2 | 7/2013 | Fujigaya | |
| 2007/0052295 A1* | 3/2007 | Frucht | H02J 7/0024 307/66 |
| 2010/0211685 A1* | 8/2010 | McDowall | H04L 63/061 709/227 |
| 2011/0151854 A1* | 6/2011 | Prakash | H04L 67/125 455/419 |
| 2011/0208987 A1 | 8/2011 | Fujigaya | |
| 2013/0324113 A1* | 12/2013 | Jechoux | H04W 88/06 455/426.1 |
| 2016/0036628 A1* | 2/2016 | Gupta | H04W 4/70 455/420 |
| 2016/0050563 A1* | 2/2016 | Bronk | H02J 50/10 726/7 |
| 2017/0337953 A1* | 11/2017 | Zawodny | G11C 7/06 |

FOREIGN PATENT DOCUMENTS

| | | |
|---|---|---|
| JP | 2007-149091 | 6/2007 |
| JP | 2009-282776 A | 12/2009 |
| JP | 2011-170730 A | 9/2011 |

OTHER PUBLICATIONS

Wikipedia "Controller" page, retrieved from https://en.wikipedia.org/wiki/Controller_(computing) (Year: 2019).*
Wikipedia Arbiter page from date May 30, 2015, retrieved using the WayBackMachine, from https://web.archive.org/web/20150530132949/https://en.wikipedia.org/wiki/Arbiter_(electronics) (Year: 2015).*
International Search Report and Written Opinion for International Patent Application No. PCT/JP2015/070288 dated Oct. 20, 2015, 10 pages.

* cited by examiner

ELECTRONIC CIRCUIT BOARD

CROSS-REFERENCE TO RELATED APPLICATIONS

This application is a continuation of PCT international Application Ser. No. PCT/JP2015/070288, filed on Jul. 15, 2015, which designates the United States; the entire contents of which are incorporated herein by reference.

FIELD

Embodiments described herein relate generally to an electronic circuit board.

BACKGROUND

There is a known configuration including a main server, a backup server, and a shared storage that can be accessed from both of the main server and the backup server via a network in order to achieve high availability of a server computer utilized in an information processing system. In this configuration, the main server proceeds with processing while storing, in the shared storage, data necessary for a state restoration when failure (abnormality) occurs in the main server. Then, in the case where failure occurs in the main server, the backup server reads the data recorded in the shared storage, reproduces (restores) the state before occurrence of the failure in the main server, and continues the processing in the place of the main server.

DETAILED DESCRIPTION

In general, according to one embodiment, an electronic circuit board includes a nonvolatile memory, a reading circuit to read data stored in the nonvolatile memory, a switch, and a communication circuit. When power is supplied from a first power source, the switch performs switching to a first state in which the nonvolatile memory and a host device configured to read and write data from and in the nonvolatile memory are connected. When power is supplied from a second power source, the switch performs switching to a second state in which the host device and the nonvolatile memory are not connected and the reading circuit and the nonvolatile memory are connected. The communication circuit transmits, to an external device, the data read by the reading circuit from the nonvolatile memory when power is being supplied from the second power source.

Embodiments of an electronic circuit board according to the present invention will be described below in detail with reference to the accompanying drawings.

First Embodiment

Figure 1:
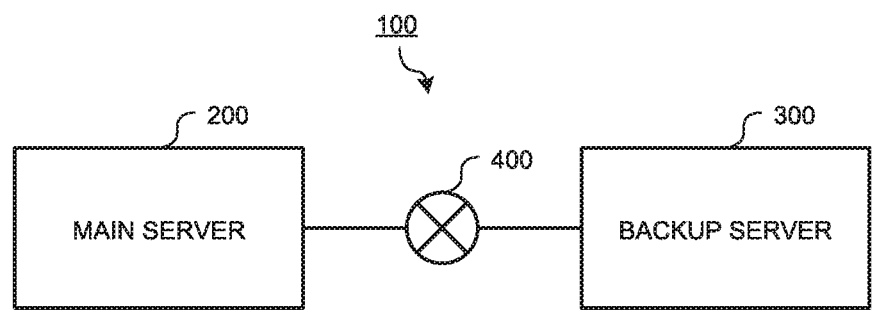
FIG. 1 is a diagram illustrating an exemplary configuration of an information processing system according to a first embodiment.

FIG. 1 is a diagram illustrating an exemplary schematic configuration of an information processing system 100 according to the present embodiment. As illustrated in FIG. 1, the information processing system 100 of the present embodiment includes a main server 200 and a backup server 300, which are connected via a network 400 such as an Ethernet (registered trademark). The main server 200 proceeds with processing while storing, in a nonvolatile memory (described later) of the main server 200, data necessary for a state restoration when failure (abnormality) occurs in the main server 200. In the case where failure occurs in the main server 200, the backup server 300 acquires the data stored in the nonvolatile memory of the main server 200. Then, the backup server 300 restores the state of the main server 200 before occurrence of the failure by using the acquired data, and continues the processing in the place of the main server 200.

Figure 2:
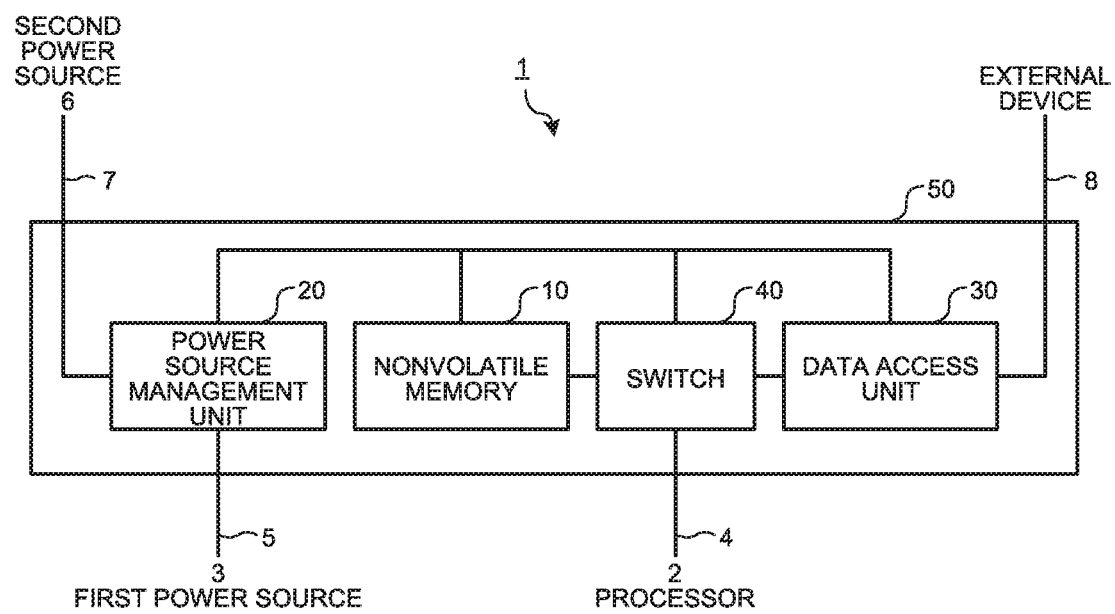
FIG. 2 is a diagram illustrating an exemplary configuration of a memory module according to the first embodiment.

The main server 200, which is an example of an information processing apparatus, includes: an electronic circuit board mounted with at least a nonvolatile memory; and a processor (an example of a host device) configured to read and write data from and in the nonvolatile memory, which are connected via a memory bus (directly connected). FIG. 2 is a diagram illustrating an exemplary configuration of an electronic circuit board 1 mounted on the main server 200. Here, the "electronic circuit board" represents an assembly formed of one substrate (e.g., printed circuit board) and an electronic circuit (including a memory and the like) mounted on the substrate. In the following description, the electronic circuit board 1 may be referred to as "memory module 1".

The memory module 1 is connected to a motherboard of a computer by a socket in the same manner as a dual in-line memory module (DIMM) of a dynamic random-access memory (DRAM) in the related art, and is operated with power supplied from a power source of the motherboard (referred to as "first power source 3" in the example of FIG. 2). The processor 2, which is an example of the host device, is mounted on the motherboard, and can read and write data from and in the memory module 1. In this example, the memory module 1 is connected, via the memory bus 4, to the motherboard on which the processor 2 is mounted. A memory bus 4 is formed of a plurality of signal lines necessary for the processor 2 to read and write data from and in the memory module 1. For example, the memory bus 4 is formed of a plurality of signal lines in accordance with an interface compatible with the DRAM.

Furthermore, the memory module 1 is connected to a power source line (power supply line) 5 through which power from the first power source 3 is supplied, and also connected to a power source line 7 through which power from an external power source (referred to as "second power source 6 in the example of FIG. 2) different from the first power source 3 is supplied. Furthermore, the memory module 1 is connected to a communication line 8 used for communication with an external device (the backup server 300 in this example). For example, the communication line 8 may be a communication line compliant with the Ethernet (Ethernet (registered trademark)) which is one of computer network standards.

As illustrated in FIG. 2, the memory module 1 includes a nonvolatile memory 10, a power source management unit 20, a data access unit 30, and a switch 40. Each of these elements is formed of an electronic circuit. In this example, electronic circuits to implement respective functions of the nonvolatile memory 10, the power source management unit 20, the data access unit 30, and the switch 40 are mounted (formed) on a single substrate 50. For convenience of description, the functions related to the present embodiment are mainly exemplified in the example of FIG. 2, but the functions of the electronic circuit board 1 are not limited thereto.

In the present embodiment, the nonvolatile memory 10 is formed of a magnetoresistive random access memory (MRAM), but not limited thereto. For example, the nonvolatile memory 10 may be formed of a phase change memory (PCM) and a memristor. In short, various kinds of the nonvolatile memories 10 directly connected to the memory bus 4 and randomly accessible from the processor 2 can be used.

The power source management unit 20 receives power from the first power source 3 and power from the second power source 6, and supplies the received power to the memory module 1. In other words, while power is supplied from any one of the first power source 3 and the second power source 6, the power source management unit 20 supplies power to the respective units (nonvolatile memory 10, data access unit 30, switch 40, and the like) of the memory module 1.

Figure 3:
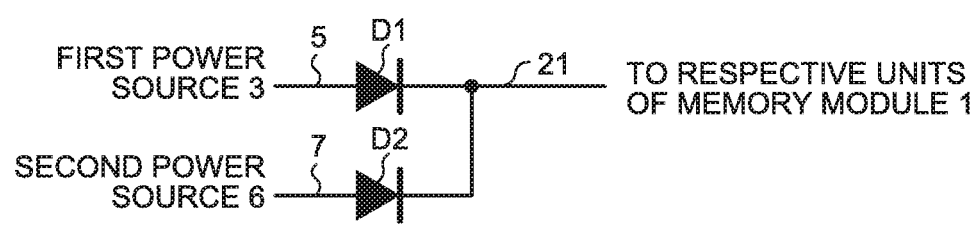
FIG. 3 is a diagram illustrating an exemplary configuration of a power source management unit according to the first embodiment.

FIG. 3 is a diagram illustrating an exemplary configuration of the power source management unit 20. In the example of FIG. 3, the power source management unit 20 includes a diode D1 interposed between the power source line 5 to which power is supplied from the first power source 3 and a feeder line 21 to feed power to the respective units of the memory module 1. Furthermore, the power source management unit 20 includes a diode D2 interposed between the power source line 7 to which power is supplied from the second power source 6 and the feeder line 21. With this configuration, as far as power is supplied from either the first power source 3 or the second power source 6, power is supplied to the respective units in the memory module 1.

Figure 4:
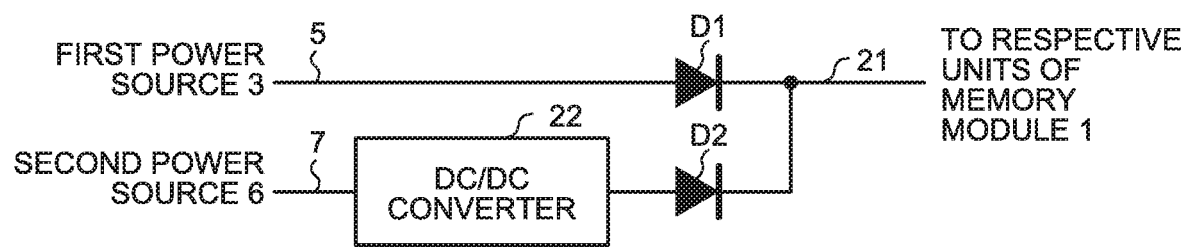
FIG. 4 is a diagram illustrating an exemplary configuration of the power source management unit according to the first embodiment.

FIG. 3 illustrates a configuration in which the first power source 3 and the second power source 6 can supply power having the same voltage, but in the case where a voltage of the second power source 6 serving as an external power source differs from a voltage required in the memory module 1, there may be a configuration in which the voltage of the second power source 6 is converted into the voltage required in the memory module 1 by using a voltage adjustment circuit such as a DC/DC converter 22 or the like as illustrated in FIG. 4. In the example of FIG. 4, the power source management unit 20 includes the DC/DC converter 22 interposed between the power source line 7 to which power is supplied from the second power source 6 and the diode D2.

Furthermore, for example, in the case where the memory module 1 requires two or more kinds of voltages, a plurality of power source management units 20 having the configuration of FIG. 3 or FIG. 4 may be used. At this point, a plurality of kinds of power corresponding to the plurality of kinds of voltages in a one-to-one basis may be supplied from the external second power source 6.

Figure 5:
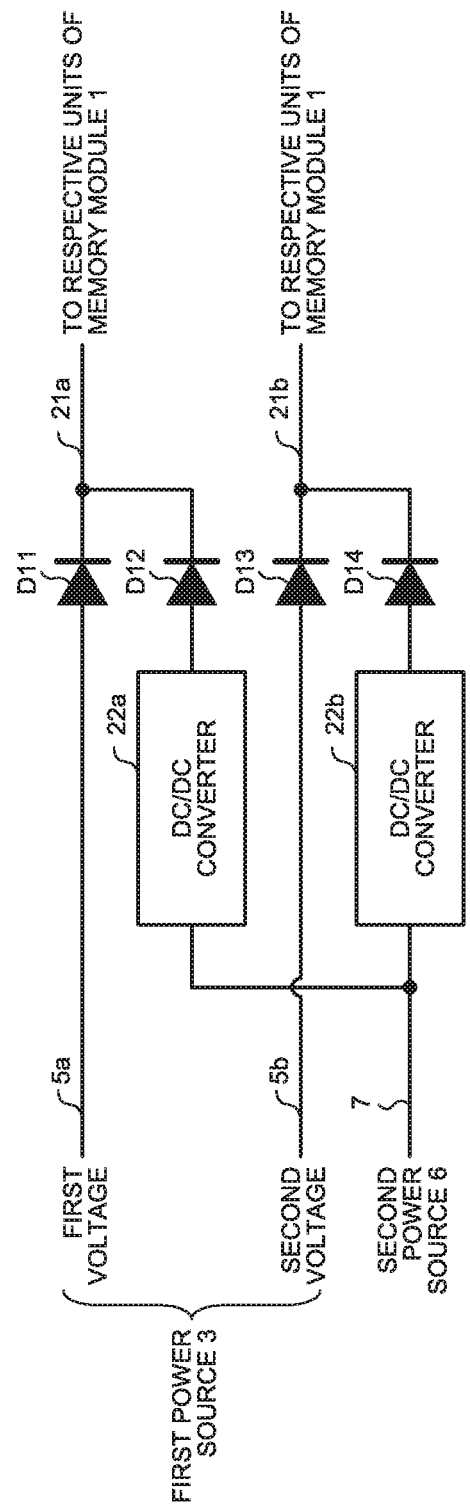
FIG. 5 is a diagram illustrating an exemplary configuration of the power source management unit according to the first embodiment.

Alternatively, as illustrated in FIG. 5, power having plurality of kinds of voltages required in the memory module 1 can be obtained by, for example, supplying power having one kind of voltage from the second power source 6, and receiving the supplied power in a plurality of DC/DC converters (22a and 22b) of the power source management unit 20, and then outputting power having voltages different from each other from the DC/DC converters (22a and 22b).

In the example of FIG. 5, the voltages required in the memory module 1 are two kinds of voltages, namely, a first voltage and a second voltage, and the DC/DC converter 22a outputs power having the first voltage, and the DC/DC converter 22b outputs power having the second voltage. Furthermore, in the example of FIG. 5, provided are: a feeder line 21a to feed power having the first voltage to the respective units of the memory module 1; and a feeder line 21b to feed power having the second voltage to the respective units of the memory module 1.

Furthermore, in the example of FIG. 5, power having the plurality of kinds of voltages (first voltage and second voltage) is supplied from the first power source 3. The power source management unit 20 includes a diode D11 interposed between the feeder line 21a and a power source line 5a to which power having the first voltage is supplied from the first power source 3. The power source management unit 20 includes a diode D12 interposed between the feeder line 21a and an output side of the DC/DC converter 22a. Furthermore, the power source management unit 20 includes a diode D13 interposed between the feeder line 21b and the power source line 5b to which power having the second voltage is supplied from the first power source 3. Furthermore, the power source management unit 20 includes a diode D14 interposed between the feeder line 21b and an output side of the DC/DC converter 22b. The power source management unit 20 may be configured as described above.

Figure 6:
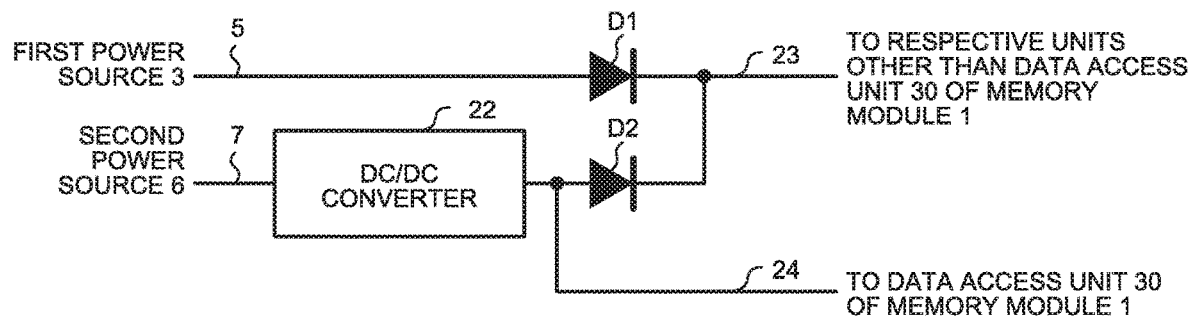
FIG. 6 is a diagram illustrating an exemplary configuration of the power source management unit according to the first embodiment.

There is no need to operate the later-described data access unit 30 of the memory module 1 while a computer (information processing apparatus) having the memory module 1 mounted thereon operates normally. Therefore, the power source management unit 20 may also have a configuration to supply power to the data access unit 30 only while power is supplied from the second power source 6. FIG. 6 is a diagram illustrating an exemplary configuration of the power source management unit 20 in this case. In the example of FIG. 6, the power source management unit 20 includes a diode D1 interposed between the power source line 5 to which power is supplied from the first power source 3 and a feeder line 23 to feed power to the respective units other than the data access unit 30 of the memory module 1. The power source management unit 20 includes a DC/DC converter 22 to convert a voltage of the second power source 6 to the voltage required in the memory module 1. Furthermore, the power source management unit 20 includes a diode D2 interposed between an output side of the DC/DC converter 22 and the feeder line 23. In the example of FIG. 6, a feeder line 24 to feed power to the data access unit 30 of the memory module 1 is connected to the output side of the DC/DC converter 22. The power source management unit 20 may be configured as described above. In FIG. 6, in the case where the first power source 3 and the second power source 6 can supply power having the same voltage, the DC/DC converter 22 is unnecessary.

In the present embodiment, the backup server 300 transmits, at regular intervals, a state confirmation signal to the main server 200 in order to confirm whether the main server 200 operates normally, and in the case where a response is returned within a predetermined period after transmitting the state confirmation signal, it is determined that the main server 200 operates normally, and in the case where a response is not received over the predetermined period after transmitting the state confirmation signal, it is determined that failure (abnormality) has occurred in the main server 200. In this example, in the case where it is of determined that failure has occurred in the main server 200, the backup server 300 performs control to start power supply from the second power source 6 to the memory module 1. Then, the backup server 300 transmits, to the memory module 1, a data request to request data stored in the nonvolatile memory 10 in order to restore the main server 200 to a state before the failure.

In this example, supplying the power from the second power source 6 to the memory module 1 means that the processor 2 is abnormal (failure is occurring in the processor 2). Meanwhile, a subject to control power supply from the second power source 6 is not limited to the backup server 300, and other devices may also be used.

Figure 7:
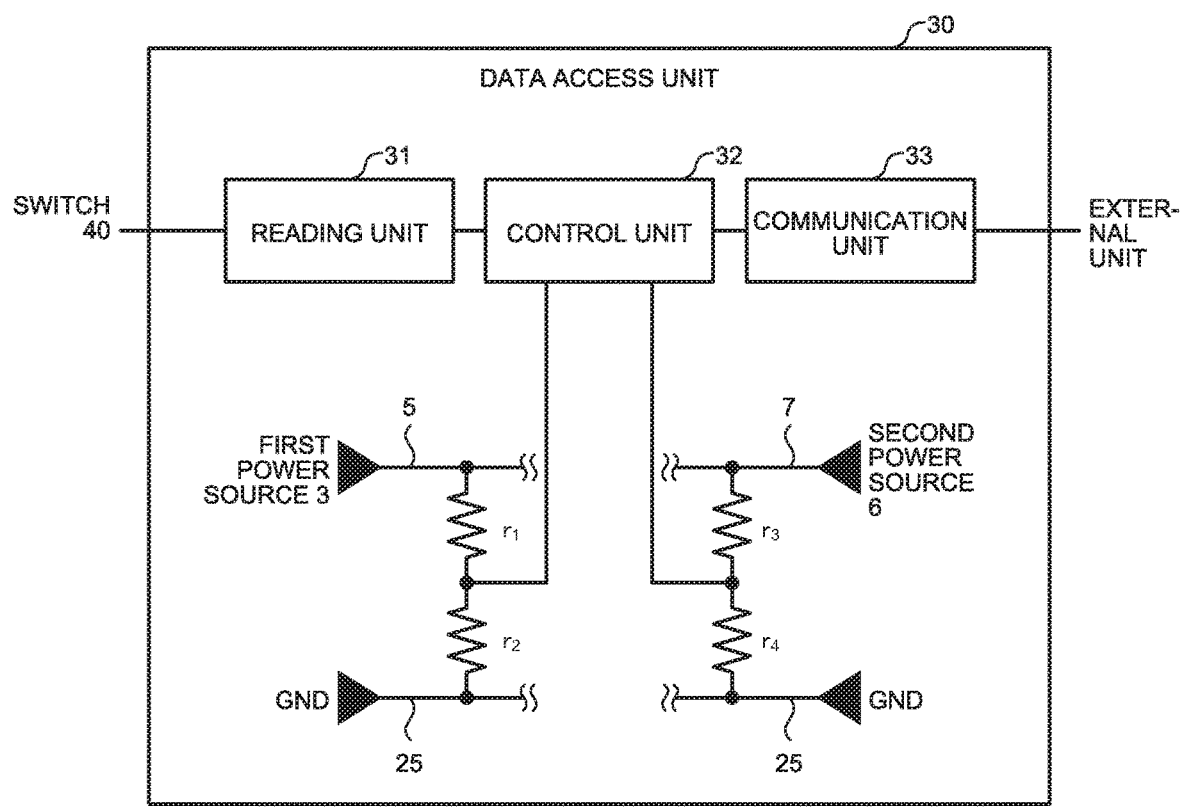
FIG. 7 is a diagram illustrating an exemplary configuration of a data access unit according to the first embodiment.

The description for FIG. 2 will be continued. The data access unit 30 has a function to read data stored in the nonvolatile memory 10 after occurrence of failure in the processor 2 (main server 200), a function to transmit the read data to an external device (in this example, the backup server 300), and the like. FIG. 7 is a diagram illustrating an exemplary detailed configuration of the data access unit 30. As illustrated in FIG. 7, the data access unit 30 includes a reading unit 31, a control unit 32, and a communication unit 33.

The reading unit 31 reads the data stored in the nonvolatile memory 10. The control unit 32 is a circuit to comprehensively control operation of the data access unit 30. In the present embodiment, when power is supplied from the first power source 3, the control unit 32 controls the later-described switch 40 so as to perform switching to a first state in which the processor 2 and the nonvolatile memory 10 are connected, and when power is supplied from the second power source 6, the control unit 32 controls the later-described switch 40 so as to perform switching to a second state in which the processor 2 and the nonvolatile memory 10 are not connected and the reading unit 31 and the nonvolatile memory 10 are connected.

In the present embodiment, the control unit 32 of the data access unit 30 has a function to detect power supplied from the first power source 3 and a function to detect power supplied from the second power source 6. In the example of FIG. 7, a resistor r1 and a resistor r2 are interposed in series in a path extending from the power source line 5 connected to the first power source 3 to a ground line (grounding conductor) 25 to which a reference voltage (typically "0 V (GND)" is supplied, and the control unit 32 can detect whether power is supplied from the first power source 3 by detecting a voltage stepped down (divided) by the resistor r1 and resistor r2. In a similar manner, in the example of FIG. 7, a resistor r3 and a resistor r4 are interposed in series in a path extending from the power source line 7 connected to the second power source 6 to the ground line 25, and the control unit 32 can detect whether power is supplied from the second power source 6 by detecting a voltage stepped down (divided) by the resistor r3 and resistor r4.

In the present embodiment, when it is detected that power is supplied from the first power source 3, the control unit 32 determines that operation of the processor 2 is normal, and transmits, to the switch 40, a switch command signal that commands switching to the first state. Furthermore, when it is detected that power is supplied from the second power source 6, the control unit 32 determines that abnormality has occurred in the processor 2 and transmits, to the switch 40, a switch command signal to command switching to the second state.

When the communication unit 33 receives a data request to request the data stored in the nonvolatile memory 10 from the backup server 300 after switching to the second state (after performing control to perform switching to the second state), the control unit 32 commands the reading unit 31 to read data stored in the nonvolatile memory 10. The reading unit 31 having received the command reads the data stored in the nonvolatile memory 10. In other words, when the communication unit 33 receives, from the backup server 300, the data request to request the data stored in the nonvolatile memory 10 after switching to the second state, the reading unit 31 of the present embodiment reads the data stored in the nonvolatile memory 10. The control unit 32 commands the communication unit 33 to transmit, to the backup server 300, the data read by the reading unit 31 from the nonvolatile memory 10 as a response to the data request.

The communication unit 33 transmits, to the backup server 300, the data read by the reading unit 31 from the nonvolatile memory 10 when power is being supplied from the second power source 6. In the present embodiment, the communication unit 33 transmits, to the backup server 300, the data read by the reading unit 31 from the nonvolatile memory 10 in accordance with the command from the control unit 32. In other words, the communication unit 33 transmits, to the backup server 300, the data read by the reading unit 31 from the nonvolatile memory 10 as a response to the data request. Meanwhile, in the present embodiment, the communication unit 33 is connected to the backup server 300 via the communication line 8 compliant with the Ethernet, but the present invention is not limited thereto and a communication method between the communication unit 33 and the backup server 300 is arbitrary. For example, communication methods such as serial communication like as a fiber channel or SPI, PCI-express, and a wireless LAN can be used. Furthermore, power supply from the second power source 6 and a communication line to the backup server 300 may be implemented by one integrated cable using, for example, power over Ethernet (registered trademark) (POE).

The description for FIG. 2 will be continued. The switch 40 performs switching to the first state or the second state in accordance with a switch command signal from the control unit 32. In short, when power is supplied from the first power source 3, the switch 40 performs switching to the first state in which the processor 2 and the nonvolatile memory 10 are connected, and when power is supplied from the second power source 6, the switch 40 performs switching to the second state in which the processor 2 and the nonvolatile memory 10 are not connected and also the reading unit 31 and the nonvolatile memory 10 are connected.

Meanwhile, for example, when it is detected that power supply from the first power source 3 is stopped and power is supplied from the second power source 6, the control unit 32 may determine that abnormality has occurred in the processor 2 and transmit, to the switch 40, a switch command signal to command switching to the second state. In such a configuration, when power supply from the first power source 3 is stopped and power is supplied from the second power source 6, the switch 40 performs switching to the second state.

For example, it is assumed that power supply from the first power source 3 is continued even though abnormality has occurred in the processor 2, but in this example, abnormality in the main server 200 can be determined as far as at least power from the second power source 6 is supplied. Therefore, when it is detected that power from the second power source 6 is supplied, the control unit 32 may transmit, to the switch 40, a switch command signal to command switching to the second state regardless of whether power from the first power source 3 is supplied. In the present embodiment, when it is detected that power from the second power source 6 is supplied, a configuration is employed in which the control unit 32 transmits, to the switch 40, a switch command signal to perform switching to the second state regardless of whether power from the first power source 3 is supplied, but not limited thereto.

Figure 8:
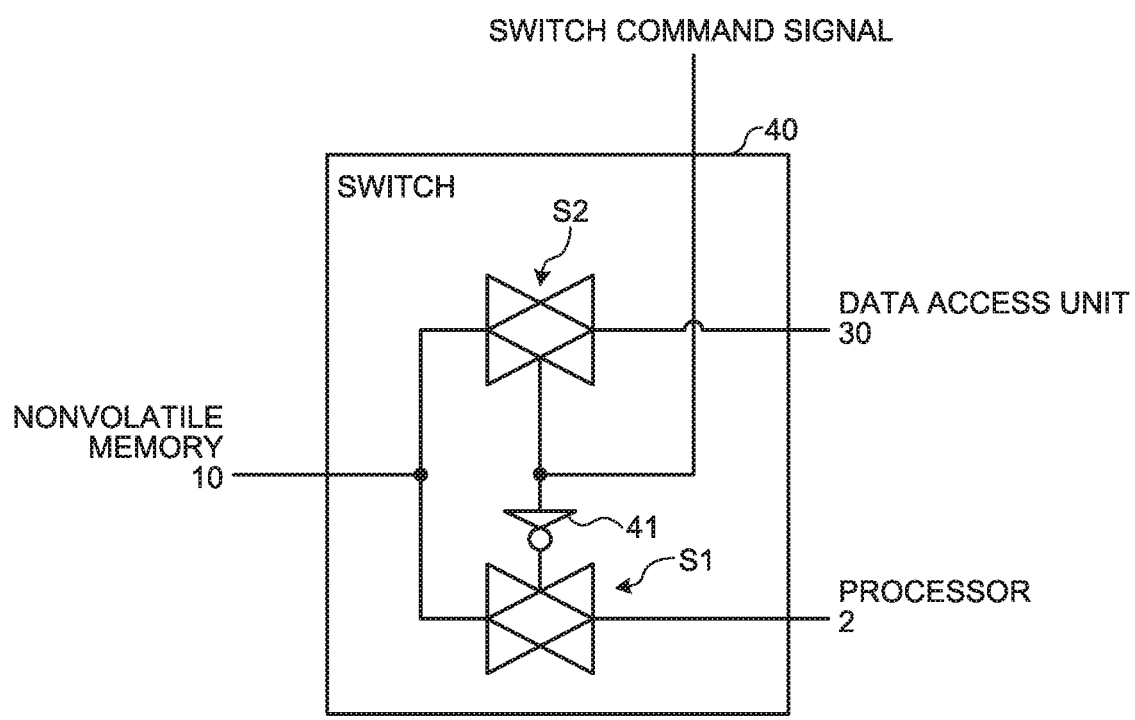
FIG. 8 is a diagram illustrating an exemplary configuration of a switch according to the first embodiment.

FIG. 8 is a diagram illustrating an exemplary configuration of the switch 40. As illustrated in FIG. 8, the switch 40 includes: a switch element S1 by which whether to connect the processor 2 and the nonvolatile memory 10 is switched; and a switch element S2 by which whether to connect the data access unit 30 (reading unit 31) and the nonvolatile memory 10 is switched.

In the example of FIG. 8, a switch command signal from the control unit 32 is input to the switch element S2, and a switch command signal inverted at a NOT gate 41 is input to the switch element S1. In this example, the switch command signal that commands switching to the first state is a signal indicating a low level, and the switch command signal that commands switching to the second state is a signal indicating a high level, but not limited thereto. For example, when the switch command signal indicating the low level is input to the switch 40, the switch element S1 transitions to an on state and the switch element S2 transitions to an off state. Consequently, the first state is established in which the processor 2 and the nonvolatile memory 10 are connected and the data access unit 30 and the nonvolatile memory 10 are not connected. For example, when the switch command signal indicating the high level is input to the switch 40, the switch element S1 transitions to the off state and the switch element S2 transitions to the on state. Consequently, the second state is established in which the processor 2 and the nonvolatile memory 10 are not connected and the data access unit 30 and the nonvolatile memory 10 are connected.

Alternatively, for example, a configuration may also be employed in which: each of the switch elements S1 and S2 transitions to the on state in the case where the switch command signal indicating the low level is input thereto; and each of the switch elements S1 and S2 transitions to the off state in the case where the switch command signal indicating the high level is input thereto. In this configuration, the switch command signal that commands switching to the first state is a signal indicating a high level, and the switch command signal that commands switching to the second state is a signal indicating a low level.

As described above, the memory module 1 of the present embodiment is connected to the host device (the processor 2 in this example) and the external device (the backup server 300 in this example), and includes a nonvolatile memory 10. When power is supplied from the first power source 3, the host device reads and writes data from and in the nonvolatile memory 10, and when power is supplied from the second power source 6, the memory module 1 transmits data stored in the nonvolatile memory 10 to the external device.

Figure 9:
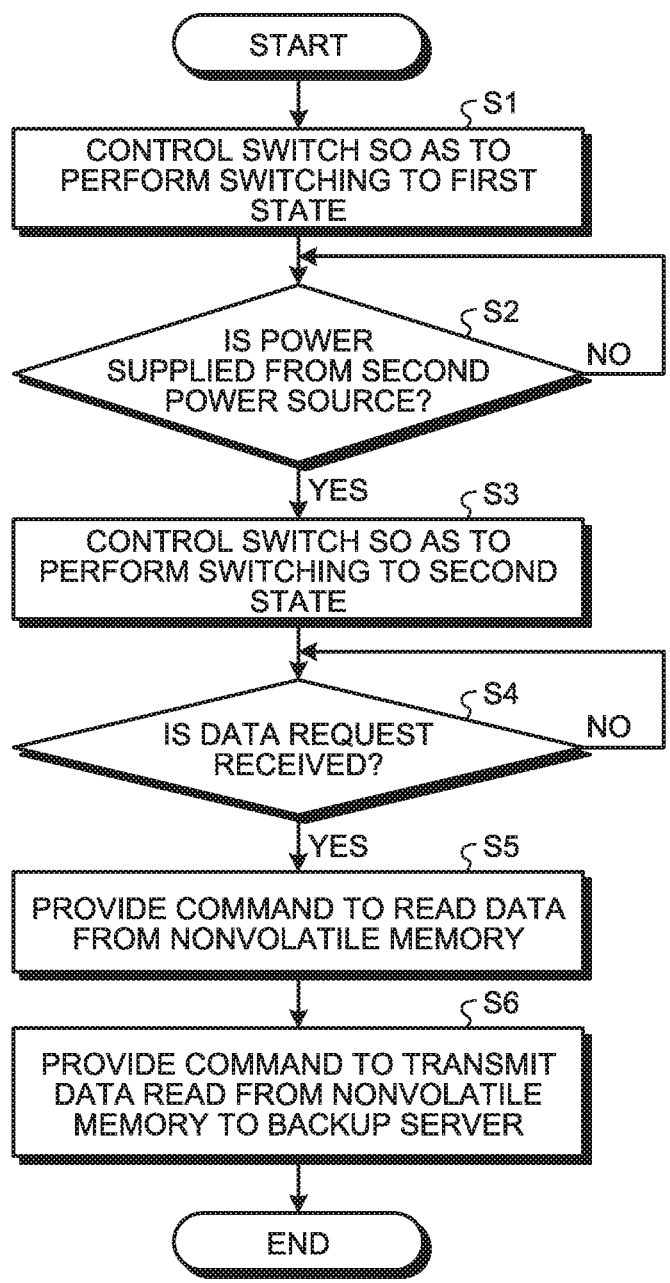
FIG. 9 is a diagram illustrating an exemplary operation of a control unit according to the first embodiment.

FIG. 9 is a flowchart illustrating exemplary operation of the control unit 32 of the present embodiment. First, when power supply from the first power source 3 to the memory module 1 is started (when the power source is turned on), the control unit 32 detects that power is supplied from the first power source 3 and transmits, to the switch 40, a switch command signal to command switching to the first state (step S1) as described above. Consequently, the memory module 1 is set into the first state. Next, when it is detected that power is supplied from the second power source 6 (step S2: Yes), the control unit 32 transmits, to the switch 40, a switch command signal to command switching to the second state (step S3). Consequently, the memory module 1 is switched to the second state from the first state.

Next, the control unit 32 checks whether a data request from the backup server 300 is received in the communication unit 33 (step S4). In the case where the data request is received in the communication unit 33 (step S4: Yes), the control unit 32 commands the reading unit 31 to read data stored in the nonvolatile memory 10 (step S5). The reading unit 31 having received the command reads the data stored in the nonvolatile memory 10 and passes the read data to the control unit 32. Next, the control unit 32 commands the communication unit 33 to transmit, to the backup server 300, the data read by the reading unit 31 from the nonvolatile memory 10 as a response to the data request (step S6). The communication unit 33 having received the command transmits, to the backup server 300, the data (data read by the reading unit 31 from the nonvolatile memory 10) passed from the control unit 32.

As described above, in the present embodiment, when power is supplied from the first power source 3, the memory module 1 mounted on the main server 200 performs switching to the first state in which the processor 2 and the nonvolatile memory 10 of the memory module 1 are connected, and when power is supplied from the second power source 6 (when abnormality is occurring in the processor 2), the memory module 1 performs switching to the second state in which the processor 2 and the nonvolatile memory 10 are not connected and the reading unit 31 and the nonvolatile memory 10 of the memory module 1 are connected. Furthermore, since the data read by the reading unit 31 from the nonvolatile memory 10 is transmitted to the backup server 300 when power from the second power source 6 is being supplied, the data recorded in the nonvolatile memory 10 of the main server 200 can be read from another computer (the backup server 300) even after occurrence of a failure (abnormality) in the main server 200. Therefore, according to the present embodiment, a configuration that can make data persistent at a high speed can be achieved in the case of making a computer, such as a server, have a redundant configuration and higher reliability.

First Modified Example of First Embodiment

Figure 10:
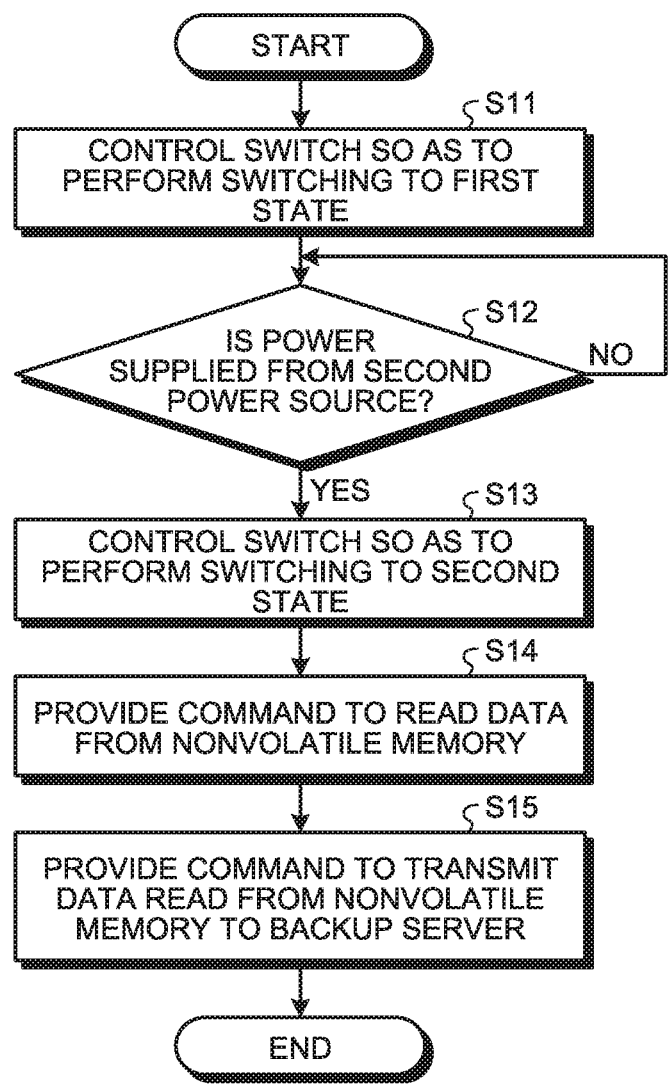
FIG. 10 is a diagram illustrating an exemplary operation of a control unit according to a modified example.

For example, the control unit 32 can perform control to voluntarily read data stored in the nonvolatile memory 10 and transmit the read data to the backup server 300 without waiting for a data request from the backup server 300. FIG. 10 is a flowchart illustrating an exemplary operation of the control unit 32 of the present modified example. Processing details in steps S11 to S13 of FIG. 10 are similar to processing details in steps S1 to S3 of FIG. 9. In FIG. 10, the processing in step S4 of FIG. 9 is omitted, and the control unit 32 commands the reading unit 31 to read the data stored in the nonvolatile memory 10 after step S13 (step S14). The reading unit 31 having received the command reads the data stored in the nonvolatile memory 10 and passes the read data to the control unit 32. Next, the control unit 32 commands the communication unit 33 to transmit, to the backup server 300, the data read by the reading unit 31 from the nonvolatile memory 10 (step S15). The communication unit 33 having received the command transmits, to the backup server 300, the data (data read by the reading unit 31 from the nonvolatile memory 10) passed from the control unit 32.

Second Modified Example of First Embodiment

Figure 11:
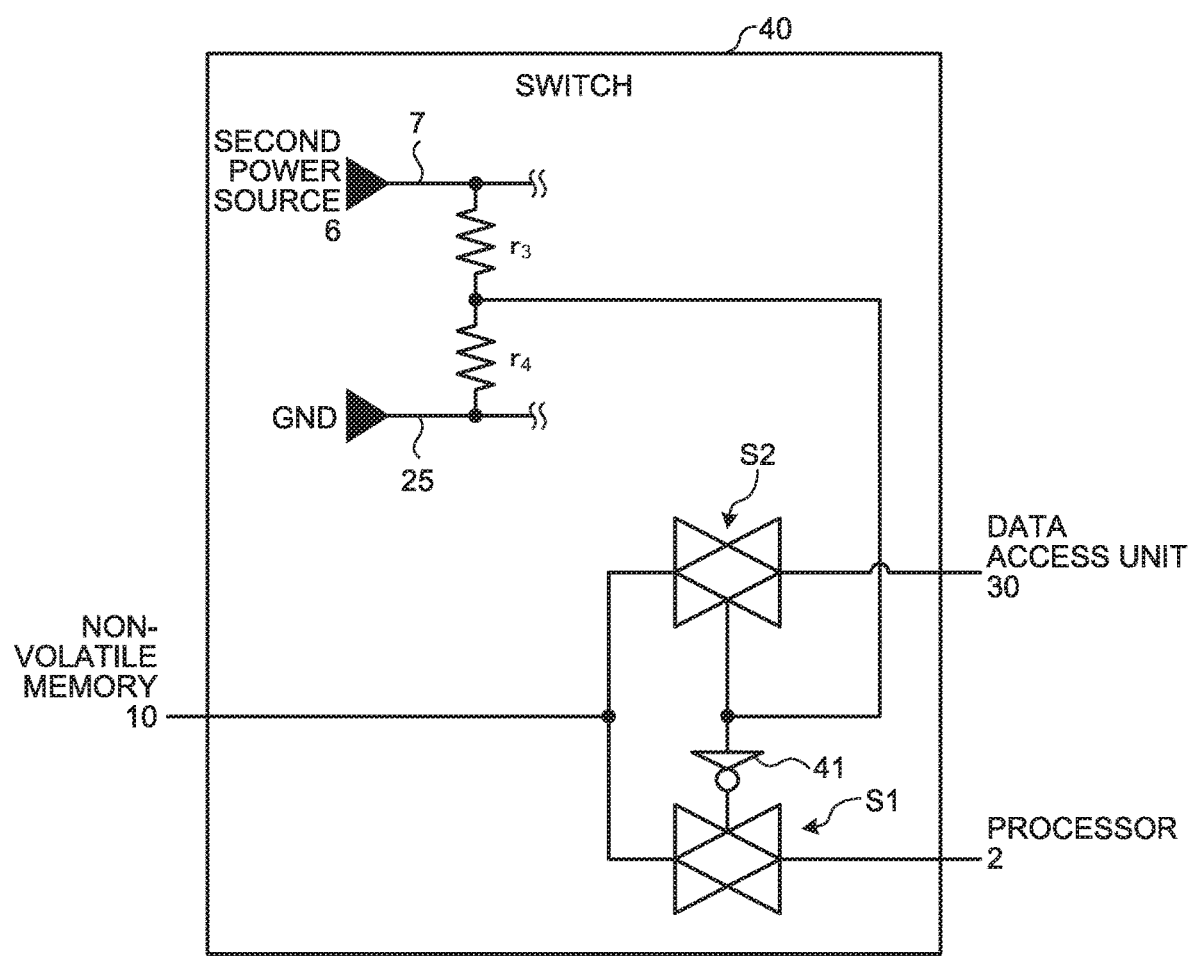
FIG. 11 is a diagram illustrating an exemplary configuration of a switch according to a modified example.

For example, the switch 40 may be configured as illustrated in FIG. 11. In the example of FIG. 11, a resistor r3 and a resistor r4 are interposed in series in a path extending from the power source line 7 connected to the second power source 6 to the ground line (grounding conductor) 25. A signal corresponding to a voltage stepped down (divided) by the resistors r3 and r4 is input to the switch element S2, and a signal corresponding to a voltage inverted at the NOT gate 41 is input to the switch element S1.

In the example of FIG. 11, when power from the second power source 6 is supplied to the power source line 7, a signal corresponding to a high level is input to the switch element S2 and a signal corresponding to a low level is input to the switch element S1. Therefore, the switch element S2 transitions to an on state and the switch element S1 transitions to an off state. Consequently, the second state is established in which the processor 2 and the nonvolatile memory 10 are not connected and the data access unit 30 and the nonvolatile memory 10 are connected. Furthermore, when power from the second power source 6 is not supplied to the power source line 7, a voltage signal corresponding to the low level is input to the switch element S2, and a voltage signal corresponding to the high level is input to the switch element S1. Therefore, the switch element S2 transitions to the off state and the switch element S1 transitions to the on state. Consequently, the first state is established in which the processor 2 and the nonvolatile memory 10 are connected and the data access unit 30 and the nonvolatile memory 10 are not connected. In the example of FIG. 11, the control unit 32 does not need to provide a switch command signal to the switch 40 (there is no need to control the switch 40).

Figure 12:
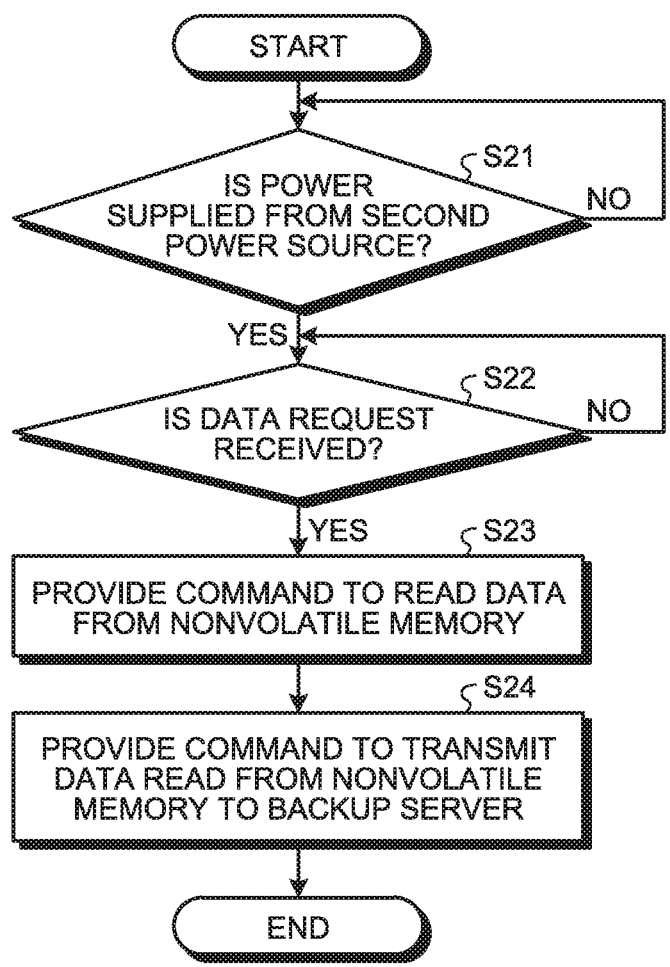
FIG. 12 is a diagram illustrating an exemplary operation of a memory access unit according to the first embodiment.

FIG. 12 is a flowchart illustrating exemplary operation of the control unit 32 of the present modified example. In this example, the control unit 32 checks whether power from the second power source 6 is supplied (step S21). When it is detected that the power from the second power source 6 is supplied (step S21: Yes), the control unit 32 checks whether a data request from the backup server 300 is received in the communication unit 33 (step S22). The processing details in subsequent steps S23 and S24 are similar to the processing details in step S5 and step S6 illustrated in FIG. 9.

Figure 13:
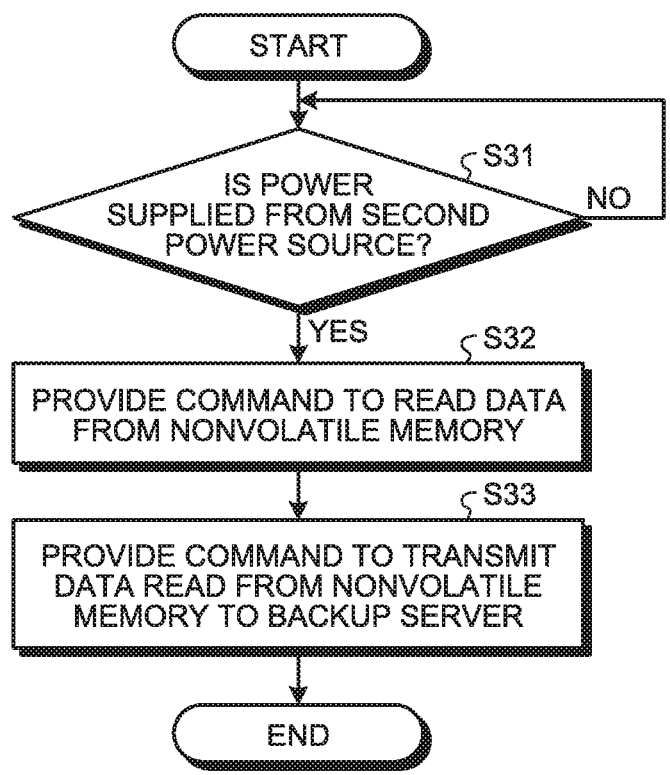
FIG. 13 is a diagram illustrating an exemplary operation of a control unit according to a modified example.

Similar to the first modified example of the first embodiment described above, the control unit 32 can also perform control to voluntarily read the data stored in the nonvolatile memory 10 and transmit the read data to the backup server 300 without waiting for a data request from the backup server 300. FIG. 13 is a flowchart illustrating an exemplary operation of the control unit 32 in this case. The processing details in step S31 of FIG. 13 is similar to the processing details in step S21 of FIG. 12. In FIG. 13, the processing in step S22 of FIG. 12 is omitted, and the control unit 32 commands the reading unit 31 to read the data stored in the nonvolatile memory 10 after step S31 (step S32). The reading unit 31 having received the command reads the data stored in the nonvolatile memory 10 and passes the read data to the control unit 32. Next, the control unit 32 commands the communication unit 33 to transmit, to the backup server 300, the data read by the reading unit 31 from the nonvolatile memory 10 (step S33). The communication unit 33 having received the command transmits, to the backup server 300, the data (data read by the reading unit 31 from the nonvolatile memory 10) passed from the control unit 32.

Third Modified Example of First Embodiment

In the first embodiment described above, in the case where it is determined that failure has occurred in the main server 200, the backup server 300 performs control to start power supply from the second power source 6 to the electronic circuit board 1. In other words, power supply from the second power source 6 is performed only in the case where the processor 2 is abnormal, but not limited thereto. For example, a configuration may be employed in which power supply from the second power source 6 is constantly performed. In this configuration, when it is detected that power supply from the first power source 3 is stopped and power is supplied from the second power source 6, the control unit 32 determines that abnormality has occurred in the processor 2 and can transmit, to the switch 40, a switch command signal to command switching to the second state. In this example, the switch 40 has a configuration same as the configuration of FIG. 8, and the switch 40 performs switching to the second state in accordance with the switch command signal from the control unit 32. In other words, the switch 40 may perform switching to the second state when power supply from the first power source 3 is stopped and power is supplied from the second power source 6.

Furthermore, as described above, it is also assumed that power supply from the first power source 3 is continued even though abnormality occurs in the processor 2. Therefore, for example, the backup server 300 may monitor whether operation of the main server 200 is normal and in the case of detecting occurrence of failure in the main server 200, abnormality information indicating such occurrence of the failure in the main server 200 can be notified to the control unit 32 via the communication unit 33. In this example, in the case where the abnormality information from the backup server 300 is received in the communication unit 33 and power supply from the second power source 6 is detected, the control unit 32 transmits, to the switch 40, a switch command signal to command switching to the second state. In this example too, the switch 40 has a configuration same as the configuration of FIG. 8, and the switch 40 performs switching to the second state in accordance with the switch command signal from the control unit 32. In other words, the switch 40 may perform switching to the second state when the processor 2 is abnormal and power is supplied from the second power source 6.

Fourth Modified Example of First Embodiment

Figure 14:
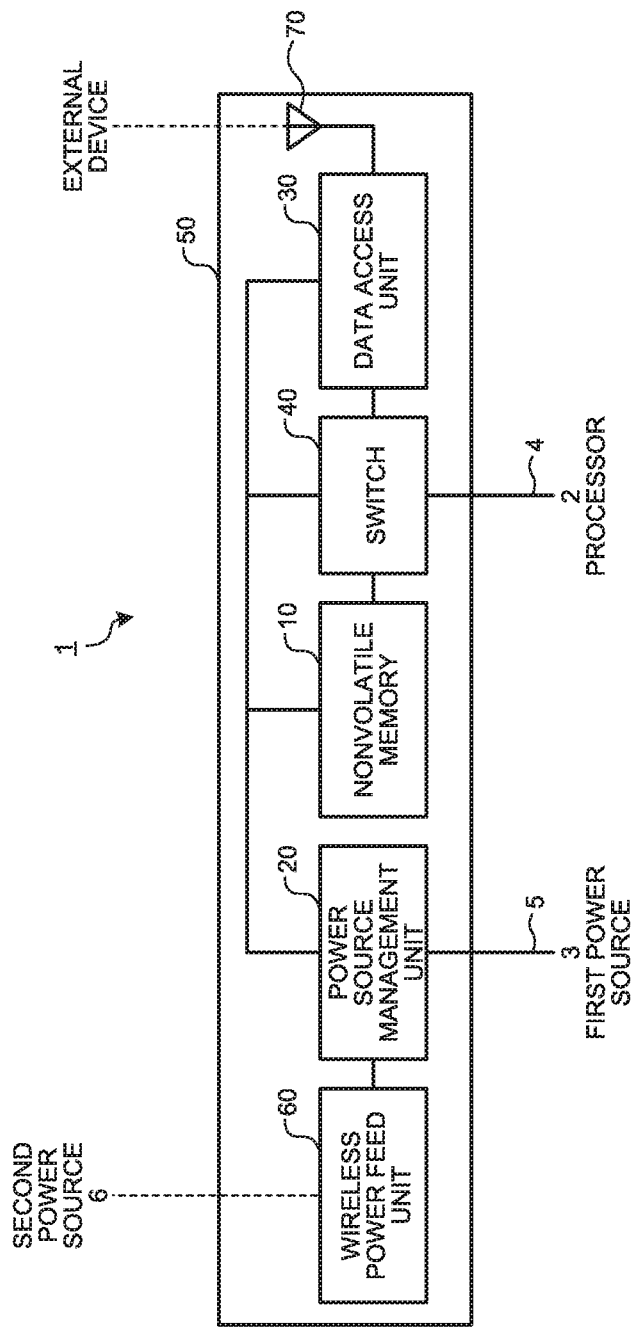
FIG. 14 is a diagram illustrating an exemplary configuration of a memory module according to a modified example.

A configuration may also be employed in which power supply from the second power source 6 to the memory module 1 and communication between the external device (for example, the backup server 300) and the memory module 1 are performed wirelessly, for example. FIG. 14 is a diagram illustrating an exemplary configuration of the memory module 1 in the present modified example. As illustrated in FIG. 14, the memory module 1 further includes a wireless power feed unit 60 configured to wirelessly receive power from the second power source 6 and supply the received power to the memory module 1. In this example, the wireless power feed unit 60 supplies, to the power source management unit 20, the power received wirelessly from the second power source 6 as power from the second power source 6. Note that various publicly known technologies can be used as a technique to wirelessly transmit power.

In the example of FIG. 14, the communication unit 33 of the data access unit 30 includes a wireless communication circuit and an antenna 70, and communicates with an external device wirelessly. In other words, in this example, the communication unit 33 wirelessly transmits, to the external device, data read by the reading unit 31 from the nonvolatile memory 10. The memory module 1 having such a configuration can perform wireless power supply from the second power source 6 and communication with the external device only by inserting the memory module 1 into a conventional memory slot of a server, and therefore, complicated wiring can be made unnecessary.

Fifth Modified Example of First Embodiment

Figure 15:
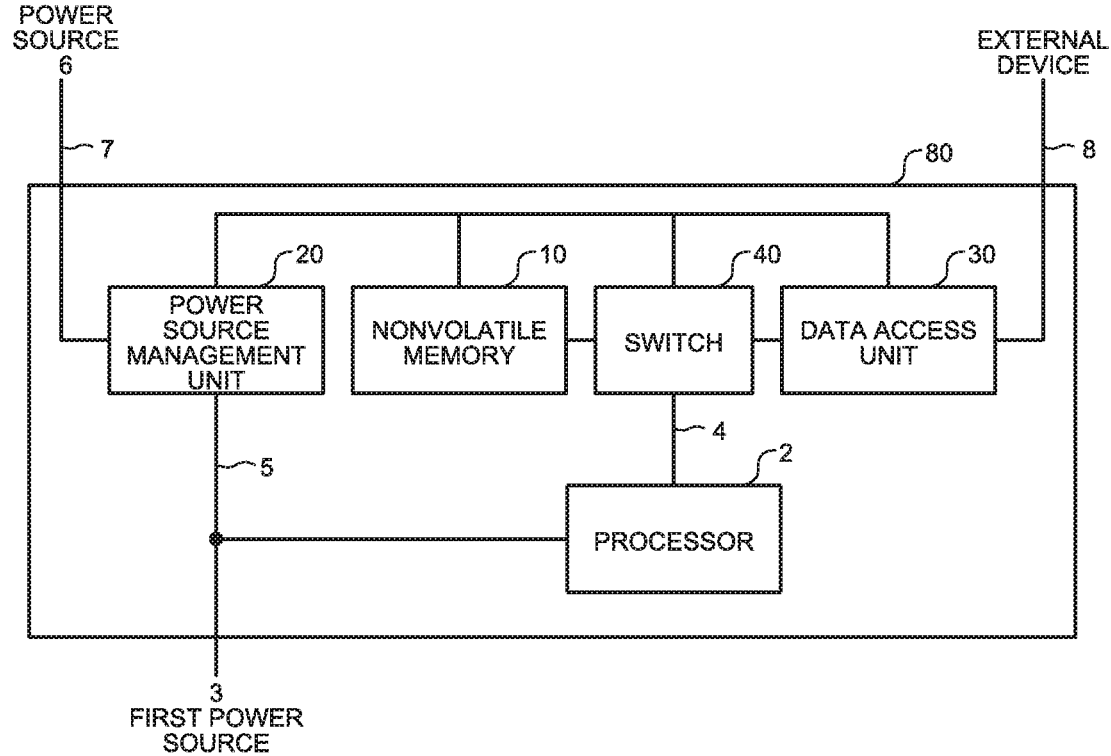
FIG. 15 is a diagram illustrating an exemplary configuration of a main server according to a modified example.

In the above-described first embodiment, the memory module 1 and the motherboard having the processor 2 mounted thereon are separate substrates, but not limited thereto. A configuration may be employed in which, for example, the above-described respective elements of the memory module 1 (the nonvolatile memory 10, power source management unit 20, data access unit 30, and switch 40), the processor 2, and the like are mounted on one substrate (motherboard) 80 as illustrated in FIG. 15.

Sixth Modified Example of First Embodiment

Figure 16:
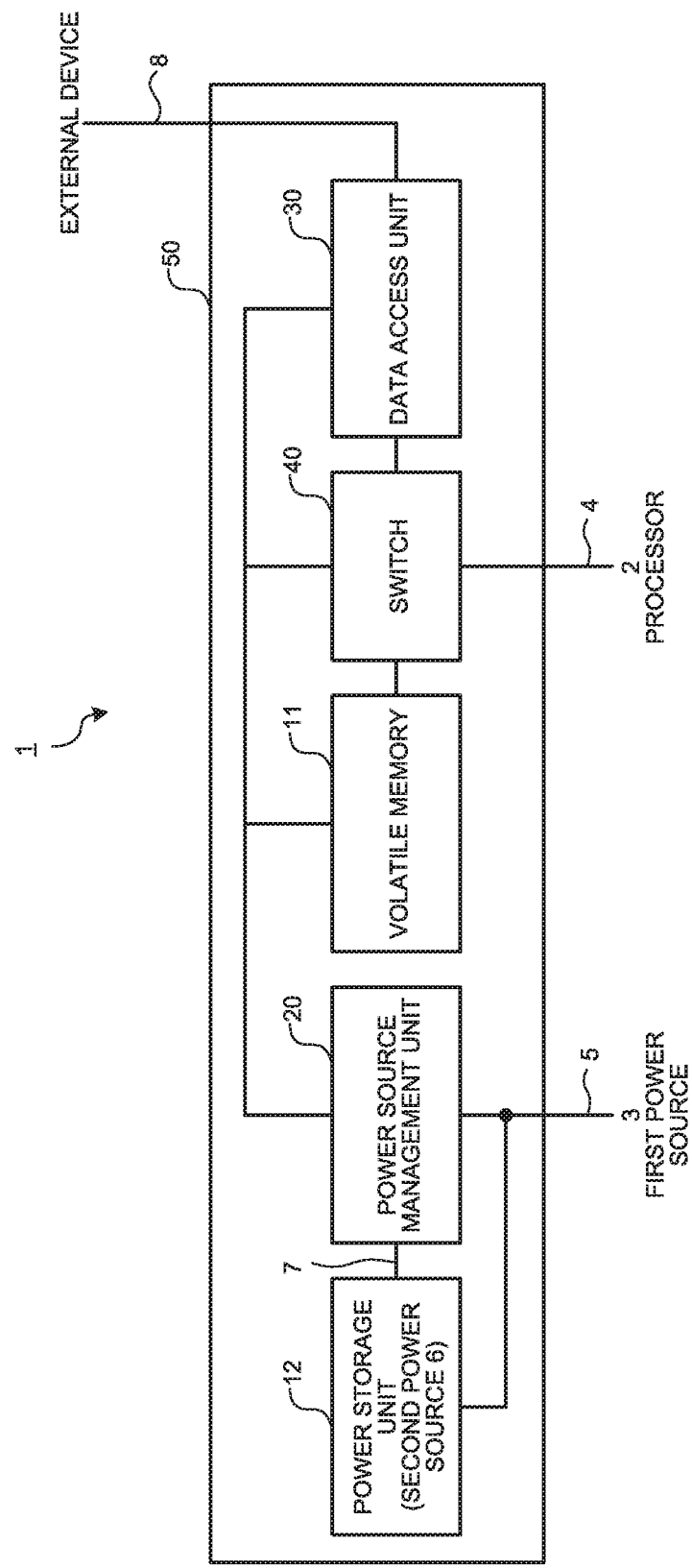
FIG. 16 is a diagram illustrating an exemplary connection between a memory module and a processor according to a modified example.

For example, a configuration may be employed in which a volatile memory such as a DRAM or an SRAM is used as a nonvolatile memory in a pseudo manner by backing up the volatile memory with a battery (supplying power from the battery although a power source is turned off). For example, as illustrated in FIG. 16, a volatile memory 11 and a power storage unit 12 that stores power supplied from the first power source 3 may be provided instead of the nonvolatile memory 10. In this example, the power storage unit 12 functions as the second power source 6, and power stored in the power storage unit 12 serving as the second power source 6 is supplied to the memory module 1 after power supply from the first power source 3 is stopped or when the processor 2 is abnormal. The volatile memory 11 is formed of a DRAM, an SRAM, or the like. The power storage unit 12 is formed of a battery, a capacitor, or the like.

Seventh Modified Example of First Embodiment

For example, the communication unit 33 can also transmit, to the backup server 300: data read by the reading unit 31 from the nonvolatile memory 10; and restoration identifying information to identify restoration information in order to restore a state of the main server 200 (an example of the information processing apparatus) including the memory module 1 and the processor 2.

Generally, a plurality of memory modules can be mounted on the motherboard of the server. Furthermore, there may be a case where two memory modules are operated as a set to increase an access bandwidth, or there may be a case where reliability is improved by providing redundancy. Therefore, even when a plurality of memory modules 1 of the present embodiment is mounted on the main server 200 and the backup server 300 reads the data of each of the memory modules 1 of the main server 200 after occurrence of failure in the main server 200, the state of the main server 200 cannot be restored unless otherwise information indicating a usage of each of the memory modules 1 of the main server 200, that is, the restoration information for restoring the state of the main server 200 (allocated physical address, bank mapping, pairing, redundancy, and the like), is known. In the present modified example, a configuration may be employed in which a unit to store the restoration information is provided in the memory module 1, and when the communication unit 33 transmits data read from the nonvolatile memory 10 to the backup server 300, the restoration information is transmitted together with the read data. Furthermore, preferably, the memory module 1 has a unit to write the restoration information in accordance with a command from the processor 2.

Alternatively, a configuration may be employed in which the memory module 1 holds, for example, memory module identification information that uniquely identifies the memory module 1 instead of storing the restoration information in the memory module 1, and when the communication unit 33 transmits, to the backup server 300, the data read from the nonvolatile memory 10, the memory module identification information is also transmitted together to the backup server 300 together with the read data. In this case, the backup server 300 or a specific server holds correspondence information indicating a correspondence relation between the memory module identification information and the restoration information, and the backup server 300 identifies the restoration information corresponding to the memory module identification information received from the memory module 1. The backup server 300 can restore the state of the main server 200 by using the identified restoration information.

In short, a configuration may be employed in which the communication unit 33 transmits, to the backup server 300, the data read by the reading unit 31 from the nonvolatile memory 10 and the restoration identifying information (or alternatively, restoration information itself or the above-described memory module identification information) that identifies the restoration information in order to restore the state of the main server 200 including the memory module 1 and the processor 2.

Second Embodiment

Figure 17:
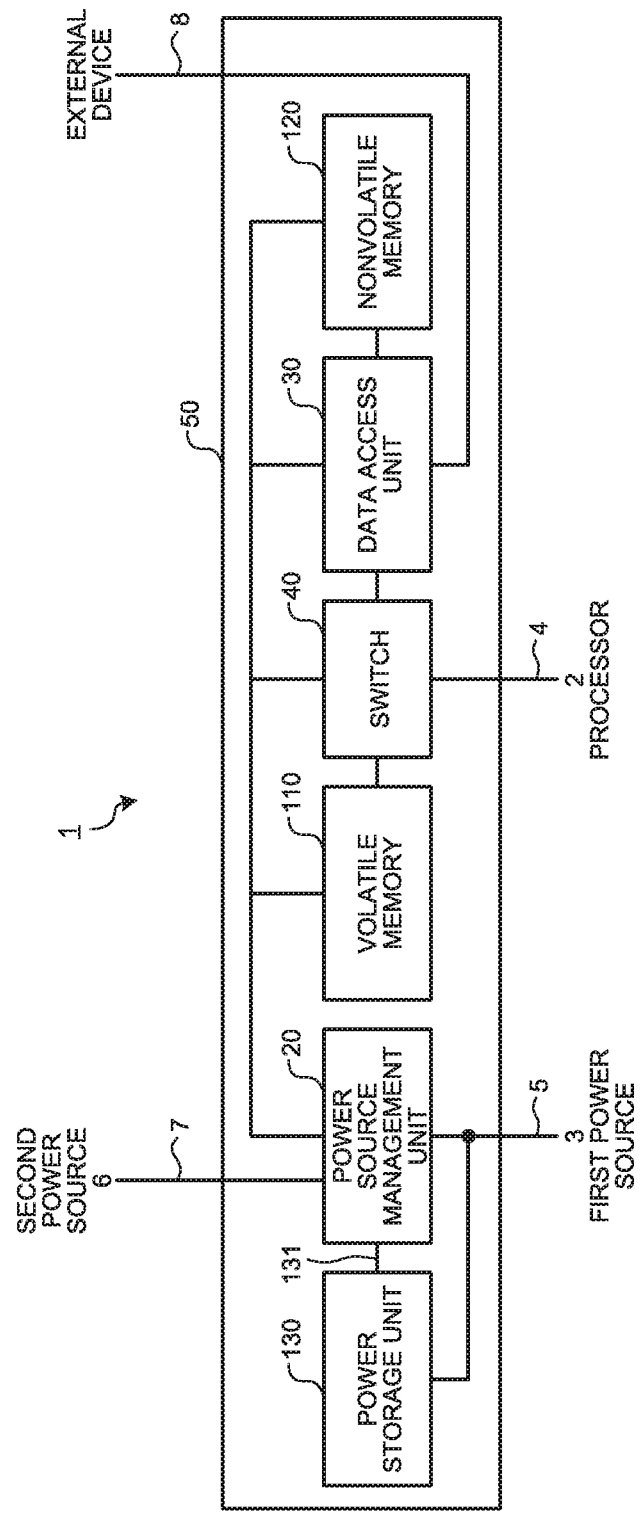
FIG. 17 is a diagram illustrating an exemplary configuration of a memory module according to a second embodiment.

Next, a second embodiment will be described. A description for a portion common with a portion of an above-described first embodiment will be appropriately omitted. FIG. 17 is a diagram illustrating an exemplary configuration of a memory module 1 of the present embodiment. The configuration differs from a configuration of FIG. 2 in that a nonvolatile memory 10 of FIG. 2 is not provided and a volatile memory 110, a nonvolatile memory 120, and a power storage unit 130 are provided.

During normal operation, a main server 200 of the present embodiment proceeds with processing while storing, in the volatile memory 110 of the memory module 1, data necessary for a state restoration when failure occurs in the main server. In other words, the main server 200 reads and writes data from and in the volatile memory 110 during normal operation. Then, when failure or the like occurs and stop of power supply from a first power source 3 is detected, a high-speed nonvolatile memory is implemented in a pseudo manner by saving (copying), in the nonvolatile memory 120, data stored in the data of the volatile memory 110 by using power supplied to the memory module 1 from the power storage unit 130. The volatile memory 110 is formed of, for example, a DRAM, an SRAM, or the like, and the nonvolatile memory 120 is formed of, for example, a NAND flash memory, a ReRAM, or the like.

The power storage unit 130 stores power supplied from the first power source 3. In other words, the power storage unit 130 stores power supplied from the first power source 3 during normal operation of the main server 200 (processor 2). The power storage unit 130 is formed of, for example, a battery, a capacitor, or the like. The power storage unit 130 is connected to a power source management unit 20 via a power source line 131. When the power supply from the first power source 3 is stopped, power supplied from the power storage unit 130 is used as power in order to save, in the nonvolatile memory 120, the data stored in the volatile memory 110 by performing switching to a second state in which the processor 2 and the volatile memory 110 are not connected and a data access unit 30 and the volatile memory 110 are connected.

Figure 18:
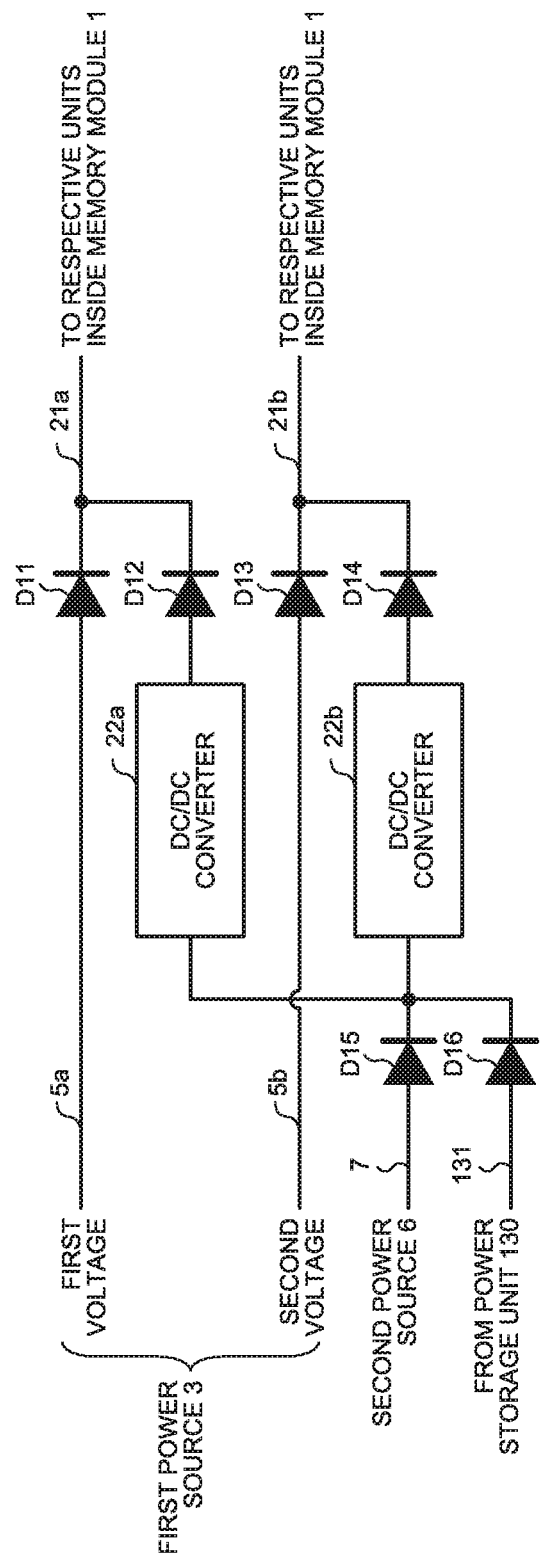
FIG. 18 is a diagram illustrating an exemplary configuration of a power source management unit according to the second embodiment.

FIG. 18 is a diagram illustrating an exemplary configuration of the power source management unit 20 of the present embodiment. In this example, a configuration illustrated in FIG. 5 is assumed, but not limited thereto. In the example of FIG. 18, power from a second power source 6 is supplied (input) to each of DC/DC converters 22a and 22b via a diode D15, and power from the power storage unit 130 is supplied to each of the DC/DC converters 22a and 22b via the diode D16. Here, power is supplied to the power source management unit 20 from three places including the first power source 3, second power source 6, and power storage unit 130, and the power supplied from the second power source 6 and the power storage unit 130 respectively are adjusted to have voltages (a first voltage or a second voltage in this example) required in the DC/DC converters (22a and 22b) and then supplied to the respective units of the memory module 1.

In this example, similar to the above-described first embodiment, a backup server 300 transmits, at regular intervals, a state confirmation signal to the main server 200 in order to confirm whether the main server 200 normally operates. In the case where a response is returned within a predetermined period after transmitting the state confirmation signal, it is determined that the main server 200 is operated normally, and in the case where a response is not received over a predetermined period after transmitting the state confirmation signal, it is determined that a failure (abnormality) has occurred in the main server 200. In this example, in the case where it is determined that failure has occurred in the main server 200, the backup server 300 performs control to start power supply from the second power source 6 to the memory module 1. Then, the backup server 300 transmits, to the memory module 1, a data request to request data stored in the volatile memory 110 in order to restore the state of the main server 200 before occurrence of the failure.

Figure 19:
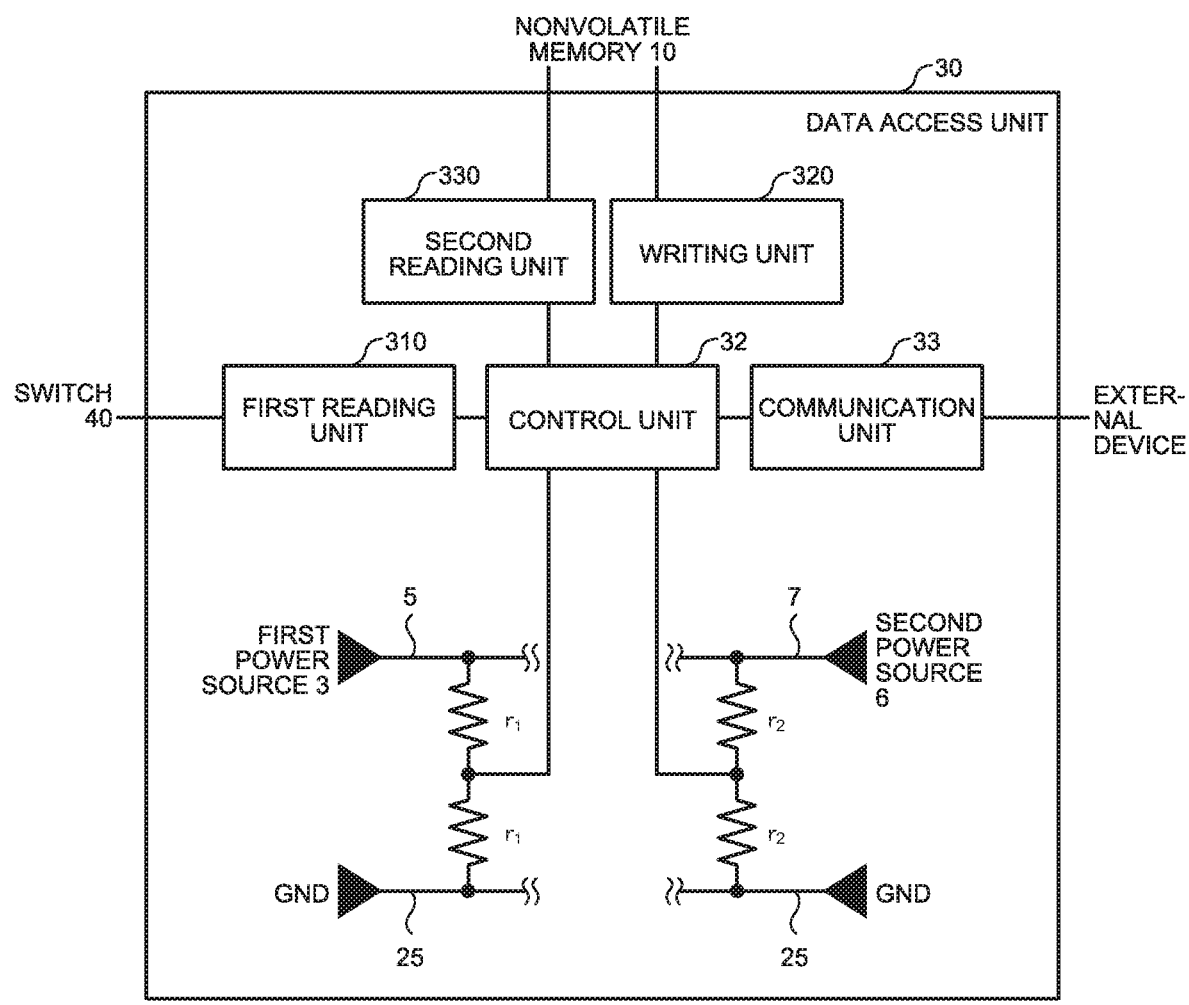
FIG. 19 is a diagram illustrating an exemplary configuration of a data access unit according to the second embodiment.

FIG. 19 is a diagram illustrating an exemplary configuration of the data access unit 30. As illustrated in FIG. 19, the data access unit 30 includes a first reading unit 310, a control unit 32, a writing unit 320, a second reading unit 330, and a communication unit 33. In this example, the control unit 32 is connected to the nonvolatile memory 120 via the writing unit 320 and the second reading unit 330.

The first reading unit 310 has a function similar to the function of a reading unit 31 illustrated in FIG. 7. In the present embodiment, when it is detected that power is supplied from the first power source 3, the control unit 32 determines that operation of the processor 2 is normal, and transmits, to a switch 40, a switch command signal that commands switching to a first state in which the processor 2 and the volatile memory 110 are connected. When it is detected that power supply from the first power source 3 is stopped, the control unit 32 determines that abnormality has occurred in the processor 2, and transmits, to the switch 40, a switch command signal that commands switching to a second state in which the processor 2 and the volatile memory 110 are not connected and the first reading unit 310 and the volatile memory 110 are connected.

In this example, the switch 40 has a configuration same as a configuration of FIG. 8. However, in this example, the volatile memory 110 is used instead of the nonvolatile memory 10 described in the first embodiment. The switch 40 performs switching to the first state or the second state in accordance with a switch command signal from the control unit 32. In short, when power is supplied from the first power source 3, the switch 40 performs switching to the first state in which the processor 2 and the volatile memory 110 are connected, and when power supply from the first power source 3 is stopped, the switch 40 performs switching to the second state in which the processor 2 and the volatile memory 110 are not connected and the first reading unit 310 and the volatile memory 110 are connected. Here, when power supply from the first power source 3 is stopped, the switch 40 can perform switching to the second state by using power supplied from the power storage unit 130. Alternatively, when power supply from the second power source 6 has been started, the switch 40 can perform switching to the second state by using the power supplied from the second power source 6.

The description for FIG. 19 will be continued. The control unit 32 commands the first reading unit 310 to read the data stored in the volatile memory 110 after transmitting, to the switch 40, a switch command signal to command switching to the second state. The first reading unit 310 having received the command reads the data stored in the volatile memory 110. In other words, the first reading unit 310 reads the data stored in the volatile memory 110 after switching to the second state. Here, the first reading unit 310 can read the data stored in the volatile memory 110 by using the power supplied from the power storage unit 130 after switching to the second state. Alternatively, in the case where power supply from the second power source 6 has been started, the first reading unit 310 can read the data stored in the volatile memory 110 by using the power supplied from the second power source 6.

Next, the control unit 32 commands the writing unit 320 to write, in the nonvolatile memory 120, the data read by the first reading unit 310 from the volatile memory 110. The writing unit 320 having received the command writes, in the nonvolatile memory 120, the data passed from the control unit 32 (data read by the first reading unit 310 from the volatile memory 110). In other words, the writing unit 320 writes, in the nonvolatile memory 120, the data read by the first reading unit 310 from the volatile memory 110 after switching to the second state. Here, the writing unit 320 can write, in the nonvolatile memory 120, the data read by the first reading unit 310 from the volatile memory 110 by using the power supplied from the power storage unit 130 after switching to the second state. Alternatively, in the case where power supply from the second power source 6 has been started, the writing unit 320 can write, in the nonvolatile memory 120, the data read by the first reading unit 310 from the volatile memory 110 by using the power supplied from the second power source 6.

Then, when the communication unit 33 receives, from the backup server 300, a data request to request the data stored in the volatile memory 110, the control unit 32 commands the second reading unit 330 to read the data stored in the nonvolatile memory 120 (data copied from the volatile memory 110). As described above, in this example, the backup server 300 transmits a data request to the memory module 1 after performing control to start power supply from the second power source 6. Therefore, in the stage when the memory module 1 receives the data request, power from the second power source 6 is being supplied to the memory module 1. The control unit 32 may also check whether power from the second power source 6 is being supplied before checking whether the communication unit 33 has received a data request.

The second reading unit 330 having received the command from the control unit 32 reads the data stored in the nonvolatile memory 120. Then, as a response to the data request, the control unit 32 commands the communication unit 33 to transmit, to the backup server 300, the data read by the second reading unit 330 from the nonvolatile memory 120. The communication unit 33 having received the command transmits, to the backup server 300, the data read by the second reading unit 330 from the nonvolatile memory 120. In other words, when power supply from the first power source 3 is being stopped (i.e., when power supply from the first power source 3 is stopped and power is being supplied from the second power source 6, in this example), the communication unit 33 transmits, to backup server 300, the data read by the second reading unit 330 from the nonvolatile memory 120.

Figure 20:
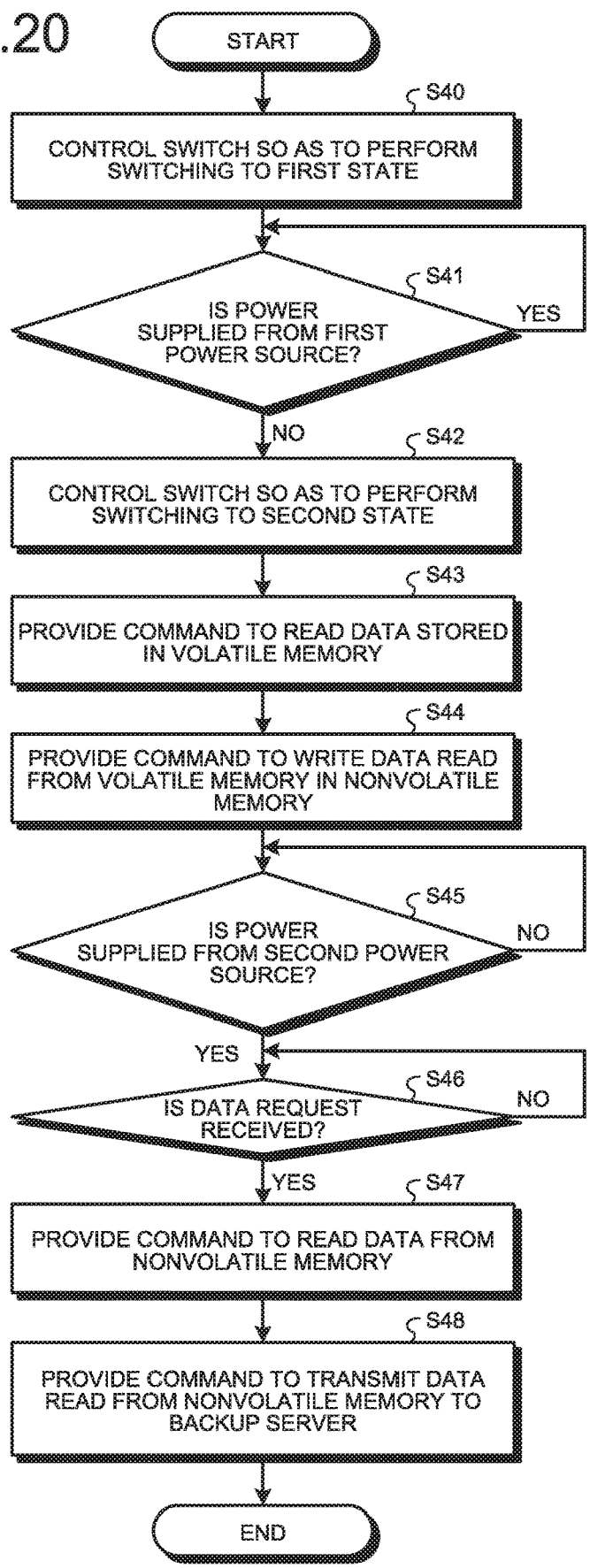
FIG. 20 is a diagram illustrating an exemplary operation of a control unit according to the second embodiment.

FIG. 20 is a flowchart illustrating an exemplary operation of the control unit 32 of the present embodiment. First, when power supply from the first power source 3 to the memory module 1 is started (when a power source is turned on), the control unit 32 detects that power is supplied from the first power source 3, and transmits, to the switch 40, a switch command signal to command switching to the first state as described above (step S40). Consequently, the memory module is brought into the first state. Next, when it is detected that power is not supplied from the first power source 3 (step S41: No), the control unit 32 transmits, to the switch 40, a switch command signal to command switching to the second state (step S42). Consequently, the memory module 1 is switched to the second state from the first state.

Next, the control unit 32 commands the first reading unit 310 to read data stored in the volatile memory 110 (step S43). The first reading unit 310 having received the command reads the data stored in the volatile memory 110 and passes the read data to the control unit 32. Next, the control unit 32 commands the writing unit 320 to write, in the nonvolatile memory 120, the data read by the first reading unit 310 from the volatile memory 110 (step S44). The writing unit 320 having received the command writes, in the nonvolatile memory 120, the data passed from the control unit 32 (data read by the first reading unit 310 from the volatile memory 110).

Next, the control unit 32 checks whether power is supplied from the second power source 6 (step S45). In the case of detecting that power is supplied from the second power source 6 (step S45: Yes), the control unit 32 checks whether a data request is received in the communication unit 33 from the backup server 300 (step S46). In the case of receiving the data request in the communication unit 33 (step 46: Yes), the control unit 32 commands the second reading unit 330 to read the data stored in the nonvolatile memory 120 (step S47). The second reading unit 330 having received the command reads the data stored in the nonvolatile memory 120 and passes the read data to the control unit 32. Next, as a response to the data request, the control unit 32 commands the communication unit 33 to transmit, to the backup server 300, the data read by the second reading unit 330 from the nonvolatile memory 120 (step S48). The communication unit 33 having received the command transmits the data (data read by the second reading unit 330 from the nonvolatile memory 120) passed from the control unit 32 to the backup server 300.

According to the above-described configuration of the present embodiment, data recorded in the nonvolatile memory 120 of the main server 200 (data copied from the volatile memory 110 to which the processor 2 accesses) can be read from another computer (backup server 300) even after occurrence of failure (abnormality) in the main server 200. Therefore, according to the present embodiment, a configuration that can make data persistent at a high speed can be achieved in the case of making a computer, such as a server, have a redundant configuration and higher reliability.

First Modified Example of Second Embodiment

Figure 21:
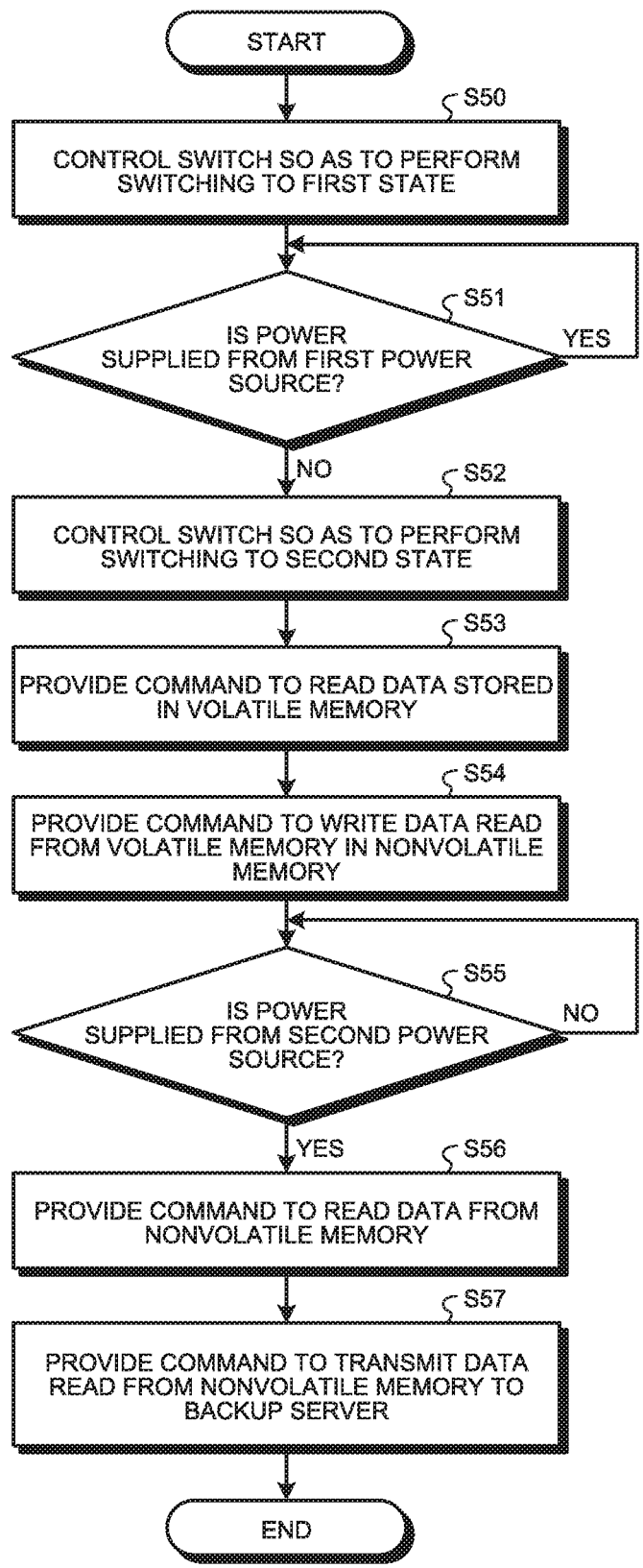
FIG. 21 is a diagram illustrating an exemplary operation of a control unit according to a modified example.

For example, the control unit 32 can perform control in which data saved (copied) in the nonvolatile memory 120 is voluntarily read and transmitted to the backup server 300 without waiting for a data request from the backup server 300. FIG. 21 is a flowchart illustrating an exemplary operation of the control unit 32 of the present modified example. Processing details in steps S50 to S55 of FIG. 21 are similar to the processing details in steps S40 to S45 of FIG. 20. In FIG. 21, processing in step S46 of FIG. 20 is omitted, and the control unit 32 commands the second reading unit 330 to read the data stored in the nonvolatile memory 120 after step S55 (when it is detected that power supply from the first power source 3 is stopped and power is supplied from the second power source 6) (step S56). The second reading unit 330 having received the command reads the data stored in the nonvolatile memory 120 and passes the read data to the control unit 32. Next, the control unit 32 commands the communication unit 33 to transmit, to the backup server 300, the data read by the second reading unit 330 from the nonvolatile memory 120 (step S57). The communication unit 33 having received the command transmits the data (data read by the second reading unit 330 from the nonvolatile memory 120) passed from the control unit 32 to the backup server 300.

Second Modified Example of Second Embodiment

Figure 22:
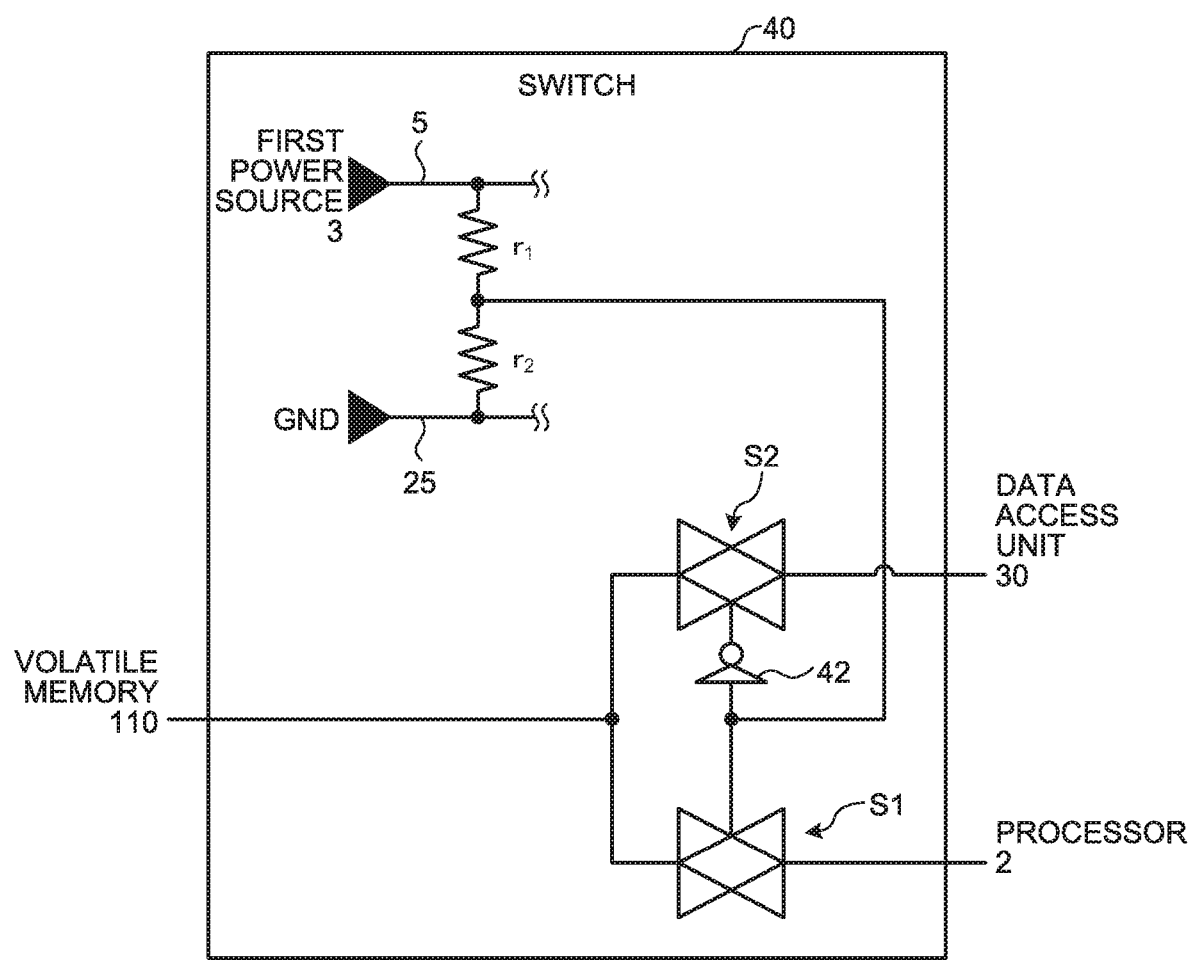
FIG. 22 is a diagram illustrating an exemplary configuration of a switch according to a modified example.

For example, the switch 40 may be configured as illustrated in FIG. 22. In the example of FIG. 22, a resistor r1 and a resistor r2 are interposed in series in a path extending from a power source line 5 connected to the first power source 3 to a ground line (grounding conductor) 25. A voltage signal corresponding to a voltage stepped down (divided) by the resistors r1 and r2 is input to a switch element S1, and a voltage signal inverted at a NOT gate 42 is input to a switch element S2. In this example, in the case where power is supplied from the first power source 3, a voltage signal corresponding to a high level is input to the switch element S1, a voltage signal corresponding to a low level is input to the switch element S2, the switch element S1 transitions to an on state, and the switch element S2 transitions to an off state. Consequently, the first state is established in which the processor 2 and the volatile memory 110 are connected and the data access unit 30 and the volatile memory 110 are not connected. Furthermore, in the case where power from the first power source 3 is not supplied, a voltage signal corresponding to the low level is input to the switch element S1, a voltage signal corresponding to the high level is input to the switch element S2, the switch element S1 transitions to the off state, and the switch element S2 transitions to the on state. Consequently, the second state is established in which the processor 2 and the volatile memory 110 are not connected and the data access unit 30 and the volatile memory 110 are connected. In the example of FIG. 22, the control unit 32 does not need to provide a switch command signal to the switch 40 (there is no need to control the switch 40).

Figure 23:
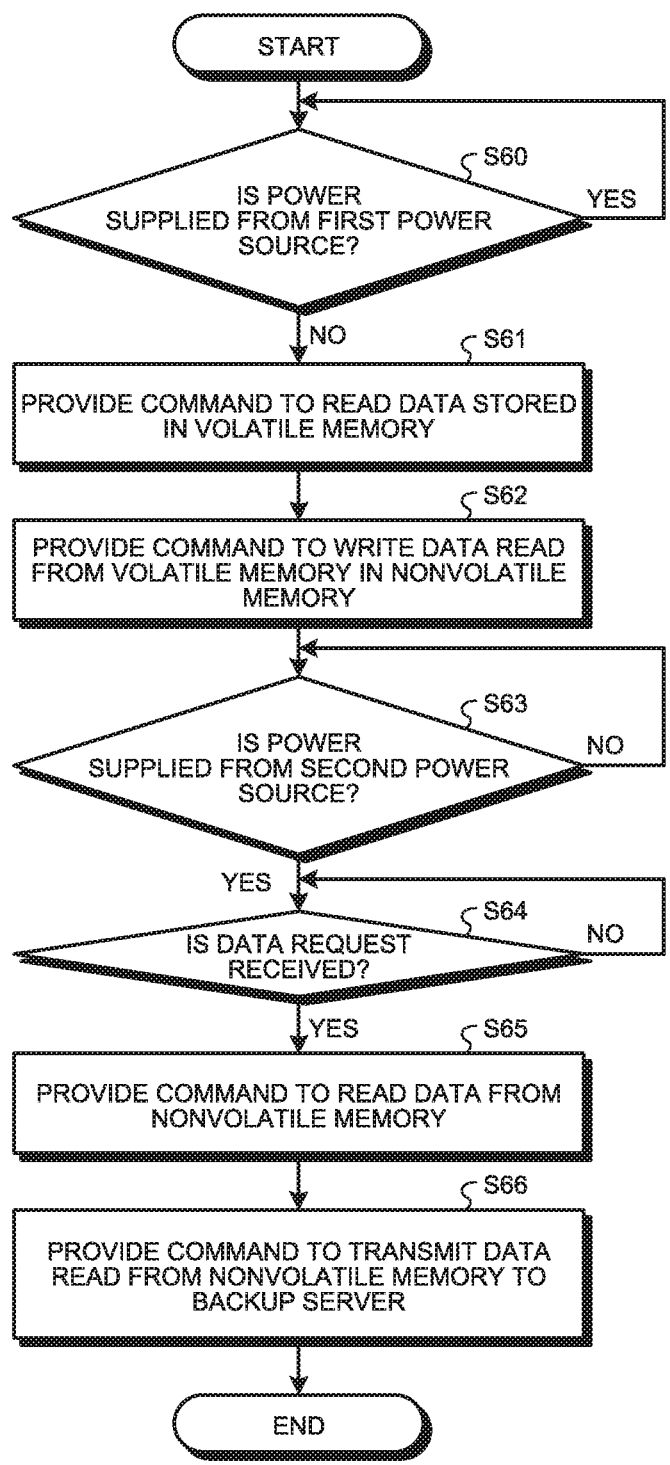
FIG. 23 is a diagram illustrating an exemplary operation of a control unit according to a modified example.

FIG. 23 is a flowchart illustrating an exemplary operation of the control unit 32 of the present modified example. As illustrated in FIG. 23, the control unit 32 first checks whether power from the first power source 3 is supplied (step S60). When it is detected that power from the first power source 3 is not supplied (step S60: No), the control unit 32 commands the first reading unit 310 to read the data stored in the volatile memory 110 (step S61). Processing details in subsequent steps S62 to S66 are similar to the processing details in the steps S44 to S48 of FIG. 20.

Figure 24:
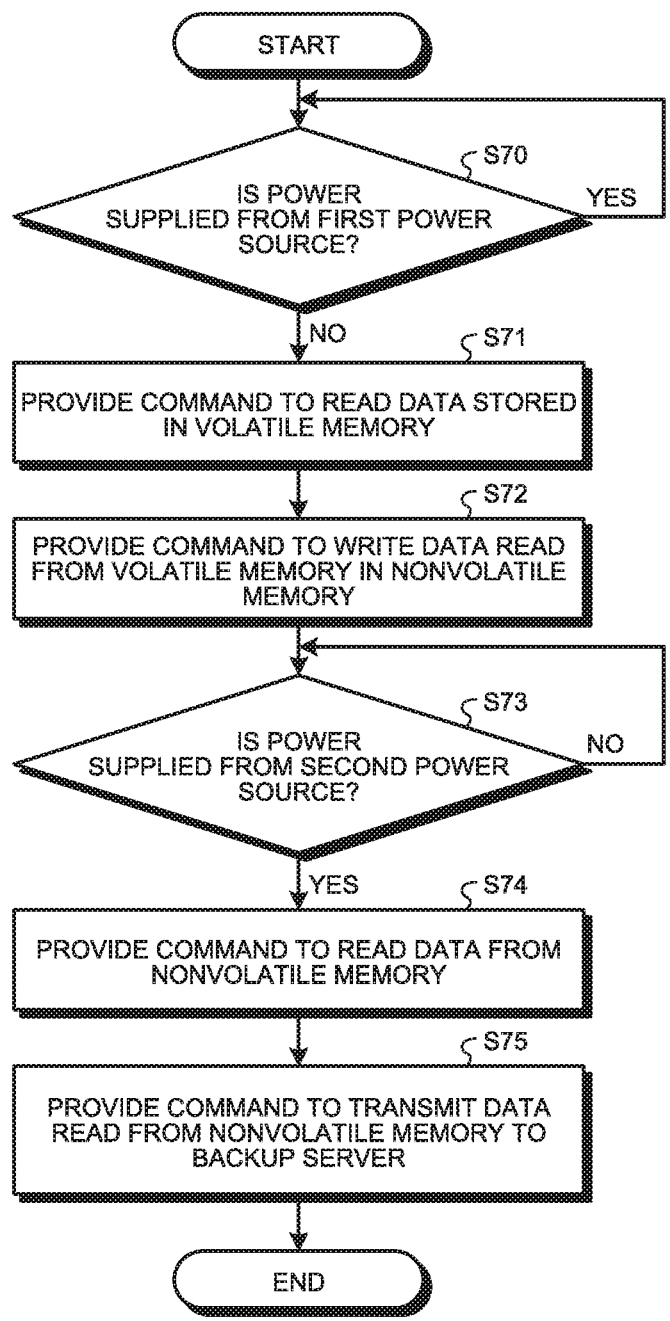
FIG. 24 is a diagram illustrating an exemplary operation of a control unit according to a modified example.

Similar to the above-described first modified example of the second embodiment, the control unit 32 can also perform control to voluntarily read the data stored in the nonvolatile memory 120 and transmit the read data to the backup server 300 without waiting for a data request from the backup server 300. FIG. 24 is a flowchart illustrating an exemplary operation of the control unit 32 in this case. Processing details in steps S70 to S73 of FIG. 24 are similar to the processing details in step S60 to step S63 of FIG. 23. In FIG. 24, the processing in step S64 of FIG. 23 is omitted, and the control unit 32 commands the second reading unit 330 to read the data stored in the nonvolatile memory 120 after step S73 (step S74). This processing is similar to the processing in step S65 of FIG. 23. Subsequent processing is similar to the processing in FIG. 23.

Third Modified Example of Second Embodiment

Figure 25:
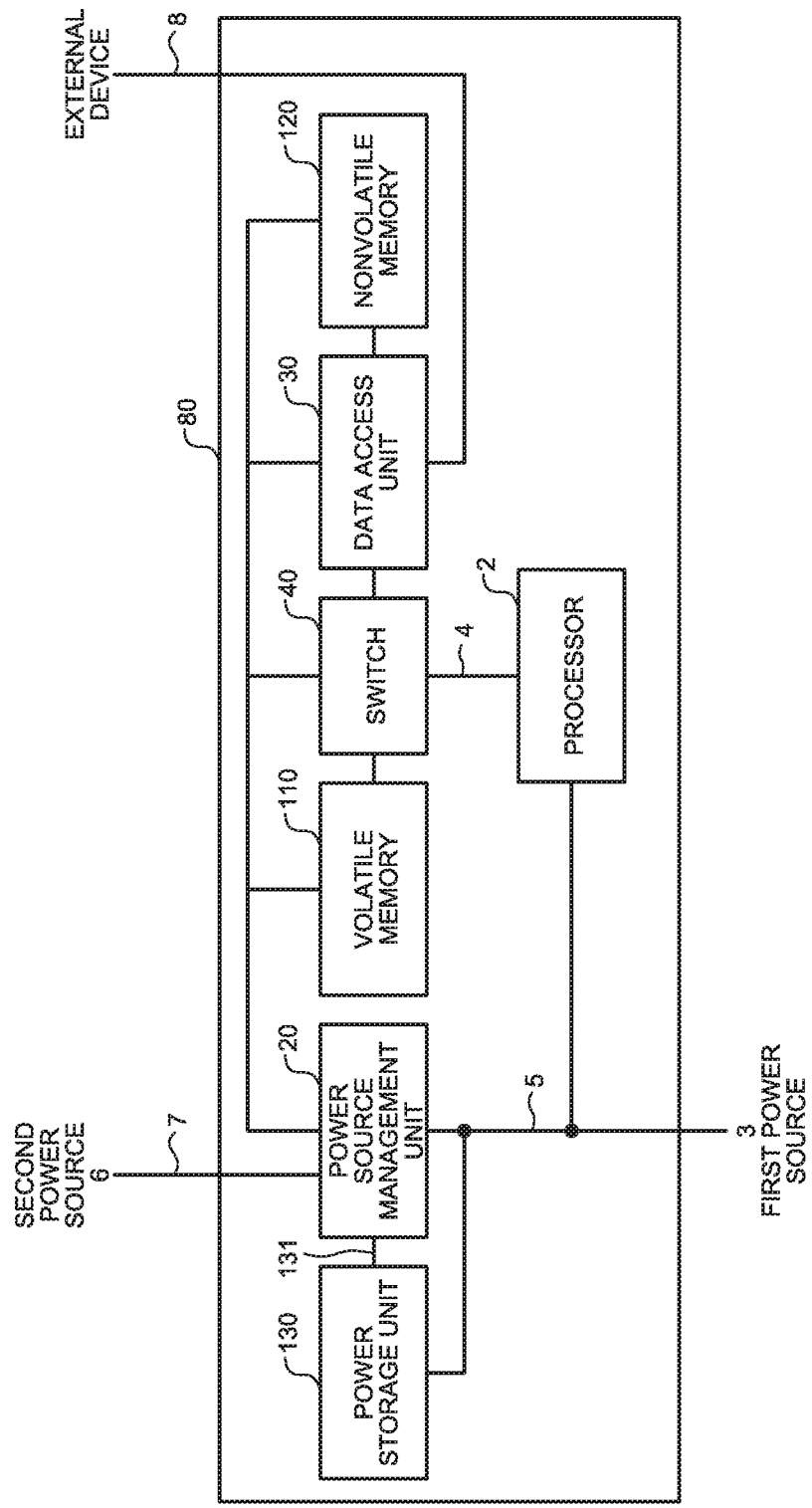
FIG. 25 is a diagram illustrating an exemplary configuration of a main server according to a modified example.

In the above-described second embodiment, the memory module 1 and a motherboard mounted with the processor 2 are separate substrates, but not limited thereto. For example, the above-described respective elements of the memory module 1 (the power storage unit 130, volatile memory 110, power source management unit 20, data access unit 30, switch 40, and nonvolatile memory 120), the processor 2, and the like may be mounted on one substrate (motherboard) 80 as illustrated in FIG. 25.

Fourth Modified Example of Second Embodiment

For example, in the case where the power storage unit 130 has a sufficiently large capacity, power may not be supplied from the second power source 6. In this case, data transmission to an external device (for example, backup server 300) is also executed by power stored in the power storage unit 130. In short, it is sufficient that when power supply from the first power source 3 is being stopped (i.e., when power supply from the first power source 3 is stopped and power is being supplied from the power storage unit 130, in this example), the communication unit 33 transmits, to backup server 300, the data read by the second reading unit 330 from the nonvolatile memory 120.

Fifth Modified Example of Second Embodiment

Similar to a seventh modified example of the first embodiment, for example, the communication unit 33 can also transmit, to the backup server 300: the data read by the second reading unit 330 from the nonvolatile memory 120 (data saved from the volatile memory 110); and restoration identifying information to identify restoration information in order to restore a state of the main server 200.

Each of the above-described embodiments and modified examples can be arbitrarily combined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An information processing system comprising:
an information processing apparatus including
an electronic circuit board;
a first power source; and
a processor connected to the electronic circuit board via a bus and configured to read and write data from and in a nonvolatile memory included in the electronic circuit board; and
an external device configured to
transmit a signal to the information processing apparatus, when no response to the signal is received from the information processing apparatus within a predetermined period, determine that a failure has occurred in the information processing apparatus, and when determining that a failure has occurred in the information processing apparatus, supply power from a second power source to the electronic circuit board, wherein the electronic circuit board includes:
the nonvolatile memory;
a reading circuit configured to read data stored in the nonvolatile memory;
a switch configured to
when power is supplied from the first power source, perform switching to a first state in which the processor and the nonvolatile memory are connected and the reading circuit and the nonvolatile memory are not connected, and
when power is supplied from the second power source, perform switching to a second state in which the processor and the nonvolatile memory are not connected and the reading circuit and the nonvolatile memory are connected; and
a communication circuit, wherein
when power is supplied from the second power source, the reading circuit reads data from the nonvolatile memory in response to a read request from the external device, and the communication circuit is configured to transmit the data read by the reading circuit to the external device,
the electronic circuit board further includes a power source management circuit configured to receive power from the first power source and power from the second power source and supply the received power to the nonvolatile memory, the reading circuit, and the switch, and
the power source management circuit includes
a first rectifier interposed between a first power source line to which power is supplied from the first power source and a feeder line to feed power to each of the nonvolatile memory, the reading circuit, and the switch, and
a second rectifier interposed between a second power source line to which power is supplied from the second power source and the feeder line.

2. The information processing system according to claim 1, wherein the external device transmits the signal to the information processing apparatus at a predetermined interval.

3. The information processing system according to claim 1, wherein the external device transmits the read request to the electronic circuit board when the external device determines that a failure has occurred in the processor.

4. The information processing system according to claim 1, wherein the power source management circuit further includes a voltage adjustment circuit interposed between the second power source line and the second rectifier and configured to convert a voltage of the second power source into a voltage required in the electronic circuit board.

5. The information processing system according to claim 1, wherein
the electronic circuit board further includes a wireless power feed circuit configured to wirelessly receive power from the second power source and supply the received power to the power source management circuit, and the communication circuit wirelessly transmits the data read by the reading circuit to the external device.

6. The information processing system according to claim 1, wherein the nonvolatile memory is a magnetoresistive random access memory (MRAM).

7. The information processing system according to claim 1, wherein
the nonvolatile memory includes:
a volatile memory; and
a power storage configured to store power supplied from the first power source, and
the power storage is the second power source.

8. The information processing system according to claim 1, wherein the communication circuit transmits, to the external device, the data read by the reading circuit from the nonvolatile memory and restoration identifying information that identifies restoration information for restoring a state of the information processing apparatus.

9. The information processing system according to claim 1, wherein the switch is connected to the processor via a memory bus.

10. The information processing system according to claim 1, wherein the communication circuit is connected to the external device via a communication line compliant with an Ethernet.

11. An information processing apparatus connected to an external device including a second power source, the external device configured to transmit a signal to the information processing apparatus; when no response to the signal is received from the information processing apparatus within a predetermined period, determine that a failure has occurred in the information processing apparatus; and when determining that a failure has occurred in the information processing apparatus, supply power from the second power source to an electronic circuit board included in the information processing apparatus, the information processing apparatus comprising:
the electronic circuit board;
a first power source; and
a processor connected to the electronic circuit board via a bus and configured to read and write data from and in a nonvolatile memory included in the electronic circuit board, wherein
the electronic circuit board includes
the nonvolatile memory,
a reading circuit configured to read data stored in the nonvolatile memory;
a switch configured to
when power is supplied from the first power source, perform switching to a first state in which the processor and the nonvolatile memory are connected and the reading circuit and the nonvolatile memory are not connected, and
when power is supplied from the second power source, perform switching to a second state in which the processor and the nonvolatile memory are not connected and the reading circuit and the nonvolatile memory are connected; and
a communication circuit, wherein
when power is supplied from the second power source, the reading circuit reads data from the nonvolatile memory in response to a read request from the external device, and the communication circuit is configured to transmit the data read by the reading circuit to the external device, the electronic circuit board further includes a power source management circuit configured to receive power from the first power source and power from the second power source and supply the received power to the nonvolatile memory, the reading circuit, and the switch, and the power source management circuit includes
a first rectifier interposed between a first power source line to which power is supplied from the first power source and a feeder line to feed power to each of the nonvolatile memory, the reading circuit, and the switch, and
a second rectifier interposed between a second power source line to which power is supplied from the second power source and the feeder line.

12. An information processing system comprising:
an information processing apparatus including
an electronic circuit board;
a first power source; and
a processor connected to the electronic circuit board via a bus; and
an external device configured to
transmit a signal to the information processing apparatus,
when no response to the signal is received from the information processing apparatus within a predetermined period, determine that a failure has occurred in the information processing apparatus, and
when determining that a failure has occurred in the information processing apparatus, supply power from a second power source to the electronic circuit board, wherein
the electronic circuit board includes:
a volatile memory,
a nonvolatile memory,
a power storage configured to store power supplied from the first power source;
a first reading circuit configured to read data stored in the volatile memory;
a second reading circuit configured to read data stored in the nonvolatile memory;
a switch configured to
when power is supplied from the first power source, perform switching to a first state in which the processor and the volatile memory are connected and the first reading circuit and the volatile memory are not connected, and
when power is supplied from the second power source, perform switching to a second state in which the processor and the volatile memory are not connected and the first reading circuit and the volatile memory are connected;
a writing circuit configured to write, in the nonvolatile memory, data read by the first reading circuit from the volatile memory after switching to the second state; and
a communication circuit, wherein
when power is supplied from the second power source, the second reading circuit reads data from the nonvolatile memory in response to a read request from the external device, and the communication circuit is configured to transmit the data read by the second reading circuit to the external device,
the electronic circuit board further includes a power source management circuit configured to receive power from the first power source and power from the second power source and supply the received power to the nonvolatile memory, the reading circuit, and the switch, and
the power source management circuit includes
a first rectifier interposed between a first power source line to which power is supplied from the first power source and a feeder line to feed power to each of the nonvolatile memory, the reading circuit, and the switch, and
a second rectifier interposed between a second power source line to which power is supplied from the second power source and the feeder line.

* * * * *